(12) United States Patent
Dutta et al.

(10) Patent No.: US 7,755,445 B2
(45) Date of Patent: Jul. 13, 2010

(54) MULTI-LAYERED HIGH-SPEED PRINTED CIRCUIT BOARDS COMPRISED OF STACKED DIELECTRIC SYSTEMS

(75) Inventors: Achyut Kumar Dutta, Sunnyvale, CA (US); Robert Olah, Sunnyvale, CA (US)

(73) Assignee: Banpil Photonics, Inc., Santa Clara, CA (US)

(*) Notice: Subject to any disclaimer, the term of this patent is extended or adjusted under 35 U.S.C. 154(b) by 0 days.

(21) Appl. No.: 11/161,353

(22) Filed: Jul. 30, 2005

(65) Prior Publication Data

US 2006/0028305 A1 Feb. 9, 2006

Related U.S. Application Data

(60) Provisional application No. 60/522,021, filed on Aug. 3, 2004.

(51) Int. Cl.
*H01P 3/08* (2006.01)
(52) U.S. Cl. .................... 333/1; 333/238; 174/117 AS
(58) Field of Classification Search ............. 333/1, 333/238; 174/117 AS
See application file for complete search history.

(56) References Cited

U.S. PATENT DOCUMENTS

| | | | | |
|---|---|---|---|---|
| 5,105,055 | A | * | 4/1992 | Mooney et al. ............. 174/27 |
| 5,724,012 | A | * | 3/1998 | Teunisse ..................... 333/238 |
| 6,924,712 | B2 | * | 8/2005 | Tabatabai ..................... 333/4 |
| 7,298,234 | B2 | * | 11/2007 | Dutta ........................ 333/246 |

* cited by examiner

*Primary Examiner*—Benny Lee

(57) ABSTRACT

High speed printed circuit boards (PCBs) are disclosed comprising a dielectrics systems with the back-side trenches, prepregs, signal lines and ground-plans, wherein the signal line and ground-plan are located on the dielectrics. Using of the open trenches in the substrate help to reduce the microwave loss and dielectric constant and thus increasing the signal carrying speed of the interconnects. Thus, according to the present invention, it is possible to provide a simple high speed PCB using the conventional material and conventional PCB manufacturing which facilitates the design of circuits with controlled bandwidth based on the trench opening in the dielectrics, and affords excellent reliability. According to this present invention, high speed PCB with the interconnect system contains whole portion or portion of interconnects for high speed chips interconnects and that have have the dielectric system with opened trench or slot to reduce the microwave loss.

16 Claims, 23 Drawing Sheets

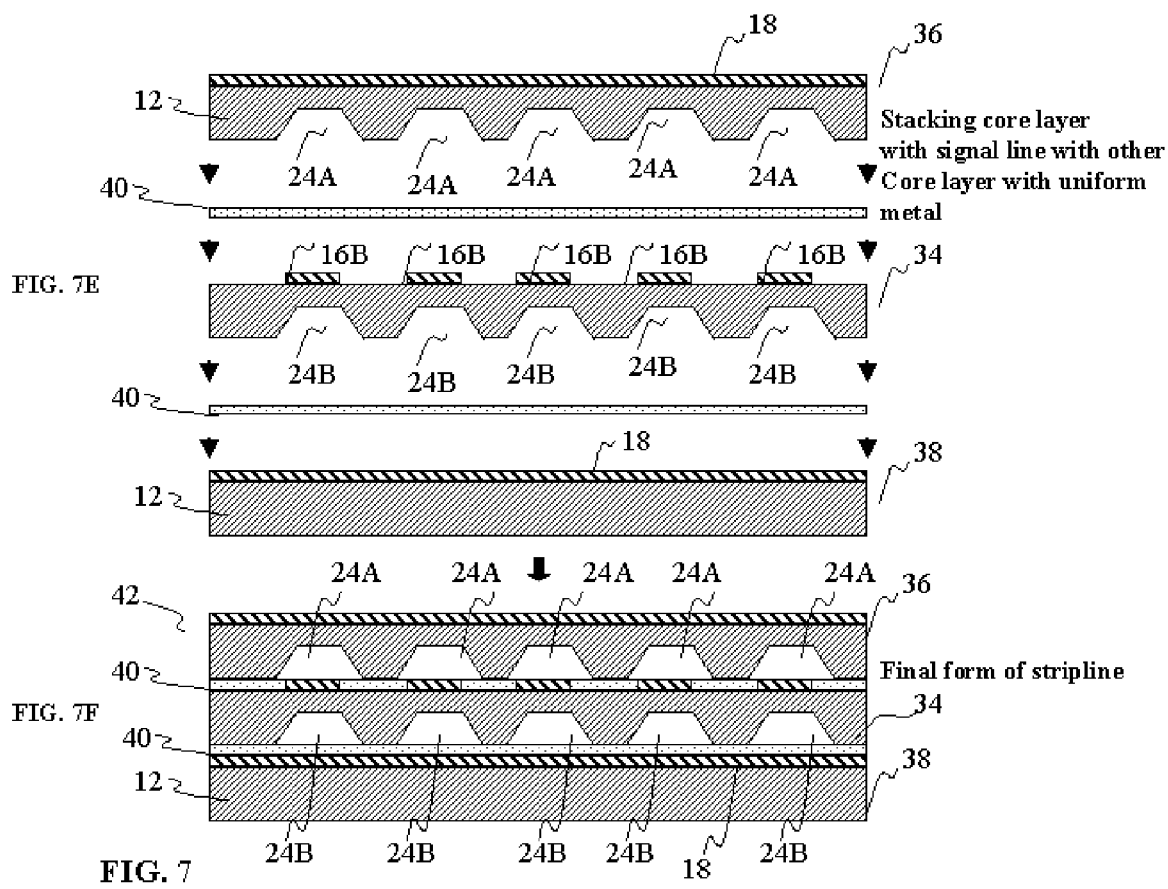

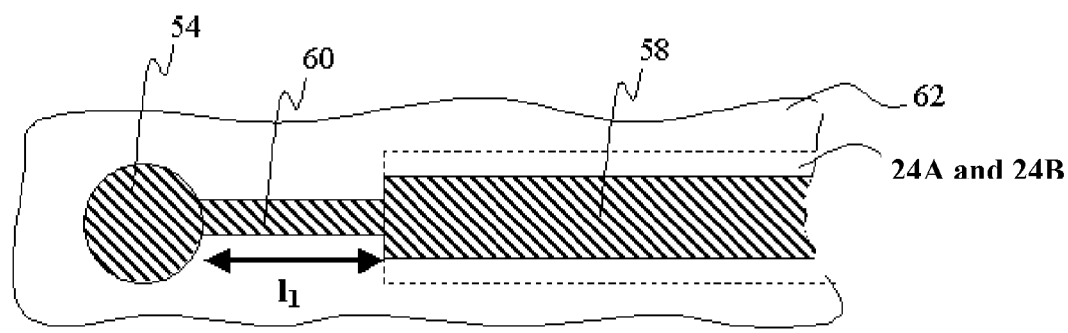
FIG. 10A
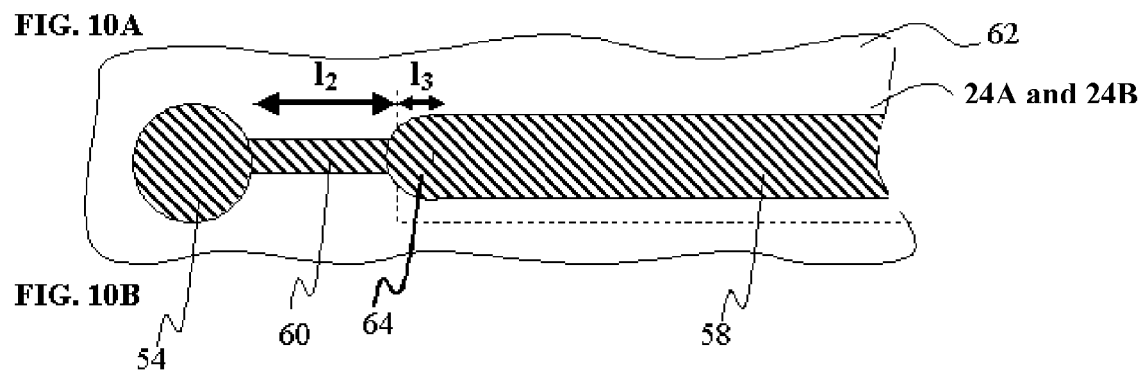
FIG. 10B
FIG. 10

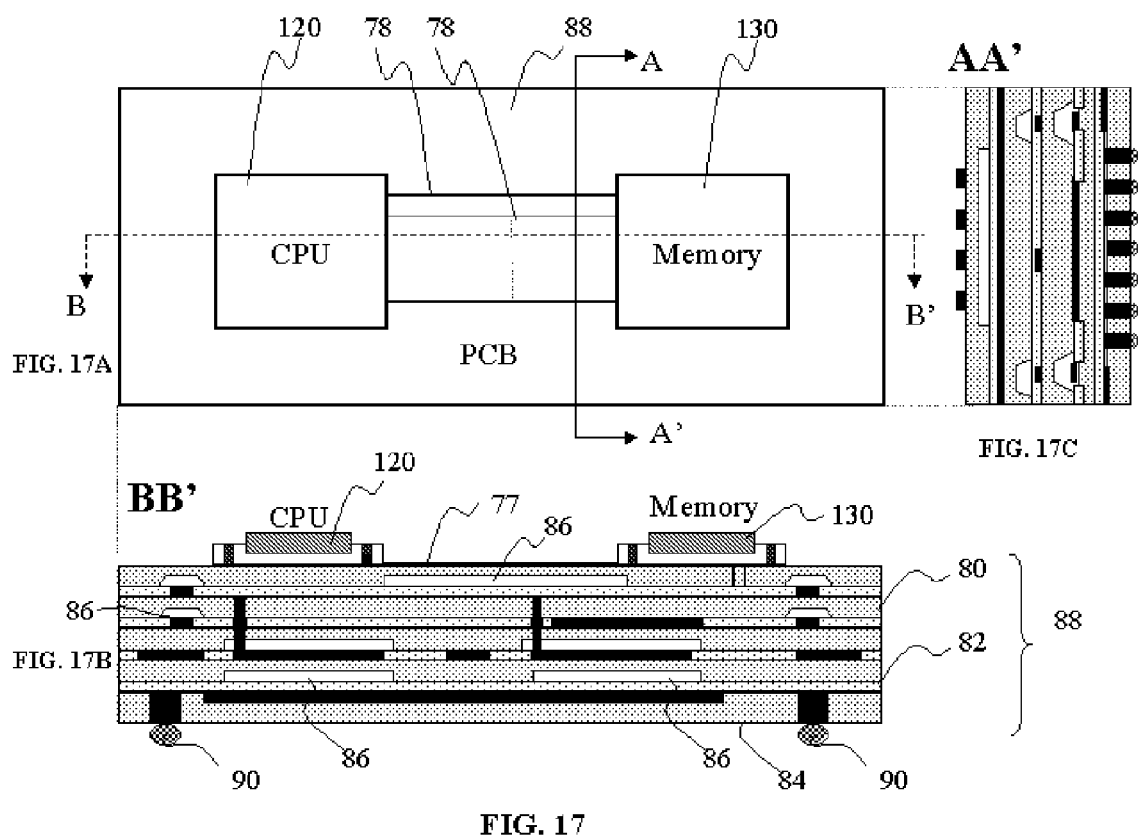

MULTI-LAYERED HIGH-SPEED PRINTED CIRCUIT BOARDS COMPRISED OF STACKED DIELECTRIC SYSTEMS

CROSS REFERENCE TO RELATED APPLICATIONS

This application claims the benefit of U.S. Provisional Patent Application No. 60/522,021 filed on Aug. 3, 2004.

FIELD OF THE INVENTION

This invention relates to high-speed electrical interconnects for chip-to-chip interconnection, more particularly on the high-speed printed circuit board (PCB), where two or more integrated circuits (ICs) are needed to connect each other's signal lines for communicating. These types of high-speed PCBs (including printed-wiring-boards (PWB)) could be used in all kinds of computers from personal computers to super-computers, servers, storage systems, game systems, imaging systems and networking systems. This invention is also related to high-speed electrical interconnections, optical interconnections, and optical-electrical interconnections, where PCBs are used for the interconnection of two or more high-speed electronics and/or optical elements.

BACKGROUND OF THE INVENTION

The increase of high level integration within electrical integrated circuits (IC), has resulted in higher data rates and larger numbers of IC interconnections. Today, the inherent signal speed of ICs has increased to 3 GHz, and shortly it will reach to 10 GHz and beyond. The number of pin connections has also increased, with a single IC requiring close to 2000 interconnections (e.g., a single processor), and shortly it will require over 5000. Simultaneously, achieving higher data rates and higher off-chip interconnection densities, will be increasingly difficult as IC technologies continue to evolve with increasing signal speed of electronic devices and increasing numbers of interconnections. Technology for off-chip interconnections on PCBs is also becoming increasingly difficult with the increased density of interconnects from die-level packaging to chip-to-chip interconnections on the PCB (hereinafter "chip" indicates the die with packaging), as well as increasing signal speeds and increasing numbers of interconnections.

With increasing signal speeds and interconnections in ICs, low-cost, high-speed interconnection techniques compatible with today's manufacturing processes are highly desirable at the consumer level. Today's PCB is mainly made of uniform epoxy-glass composite FR4) material, and FR4 and PCB manufacturing technologies are so well matured that most system vendors prefer FR4-based PCBs to keep system costs low. However, FR4 has material characteristics which limit its usage in high-speed applications with conventional interconnection structures because FR4 has a high dielectric loss which limits the bandwidth of interconnection structures.

FIG. 1 shows part of a conventional PCB. For simplicity in understanding, only a portion of the PCB is shown here. Conventional PCB 10 consists of single or multilayer of uniform core layers 12, prepreg (shorthand expression for "Preimpregnated" type epoxy, used for stacking multiple dielectric layers) 14, signal lines 16A, 16B and ground plane 18. The core layer 12 could be any uniform dielectric material. Usually, FR4 (trade name) is used as the core layer for conventional PCB. The prepreg 14 is an epoxy resin used between the core layers 12 to stack the multiple core layers 12. The high-speed electrical signal flow through the signal lines 16A, and 16B laid on the core layers 12, and the ground lines 18 are laid on the side of the core layer 12 opposite the signal lines 16A, and 16B. The thickness of the core layers 12, the relative dielectric constant of the core layers 12, the thickness of the ground layers 18, and the width of the signal lines determine the impedance of the signal line. The signal lines 16A, and 16B can be microstrip line type transmission line 16A or stripline type signal line 16B, as shown in FIG. 2. In conventional PCB technologies, the microstrip line type transmission lines 16A has the ground 18 separated by the uniform/homogeneous dielectric core layer 12A, as seen in FIG. 2A. Stripline type transmission lines 16B are also used in conventional PCB technologies, in which the signal line 16B is embedded into the homogeneous dielectric layer 12B, and both sides of the core layer 12B have a ground 18, as shown in FIG. 2B.

Conventional PCB 10, as shown in FIG. 1, is manufactured in a way corresponding to the flow chart shown in FIG. 3, which depicts an explanatory diagram for the conventional method of PCB manufacturing. The dielectric sheet 21 is made using the standard PCB technology such as the slurry casting process. The slurry is cast into about 200 .mu.m to 500 .mu.m thick ceramic sheets using a slip cast process. The PCB core layer 12 is the homogeneous layer usually used in the conventional PCB 10. After the patterning and subsequent etching 23, the signal line is made on the side of the core layers. Making the micro-via and the subsequent micro-via filling process 25 is done, if necessary. Following this, the ready-to-be-stacked sheets 27 are laminated together by a hot press to form the completed multilayer PCB 29. Density heterogeneities in the laminated samples influence any shrinkage in the sintered substrate. Therefore, this lamination process is homogeneously carried out using the correct dimensions for the die and punch with flat surfaces. Burn-out and sintering processes for the multi-layered PCB board 10 may be necessary after lamination at a temperature suitable to the dielectric material used for the sheets 21. The via hole opening and subsequent metal filling (not shown here) are usually done. A ceramic sheet 21 may have more than 10,000 via holes in a 50 to 250 .mu.m square area.

In conventional PCB 10, the signal line 16A is either laid on the dielectric material 12 or embedded into the dielectric material. Signal dissipation during propagation through the signal line 16A depends on the dissipation factor (loss tangent) of the dielectric material used as the core layer in the PCB. This dissipation occurs because the electric field (not shown) between the signal line 16A and the ground 18 passes through the dielectric material 12. This signal dispersion is proportional to the signal frequency, i.e., the signal speed. This means that the higher the signal speed, the lower the signal transmission distance can be for the fixed dielectric material. In the other words, the higher the speed, the lower the bandwidth of the signal line which is used for connecting one chip to another chip on the a PCB. If the loss tangent of the dielectric material is high, the bandwidth of the interconnection is limited so that high-speed signals cannot be sent over longer distances, while interconnection systems with dielectrics having a lower loss tangent are more capable of sending high-speed signals over longer distances.

In addition to loss tangent, the dielectric constant of dielectric material 12 is also important, especially with the electric field inside the dielectric material increasing the dielectric constant. This increased dielectric constant causes the system to experience more signal delay, increasing the need for a dielectric material with a low dielectric constant. An increased dielectric constant also causes more signal skew as the length of the signal line increases. Thus, a dielectric material with a lower dielectric constant is necessary in interconnection systems for high-speed signal interconnection. This is true for both on-chip and off-chip interconnection systems. Lower dielectric constant materials with low dielectric loss offer the following traits: (1) higher density interconnection due to reduction of cross talk, (2) reduced capacitance of the interconnection thus allowing for longer transmission line distances, and (3) lower propagation delay.

When considering signal loss and signal delay for various signal line lengths, it is highly desirable to design interconnection systems on PCBs with a low effective dielectric constant and low effective loss tangent.

Increased bandwidth is possible if materials with lower loss tangents and lower dielectric constants are used. However, new material development is necessary for off-chip interconnection technology. Improved manufacturing technology is necessary for development of off-chip interconnection technologies implemented at the product level. Conventionally, increased the interconnection bandwidth is achieved by using dielectrics with a lower loss tangent for the PCB layer. Such low loss tangent dielectric material is very expensive, and the manufacturing process for PCB manufacturing using these materials has not yet matured. Additionally, PCBs made of such low loss material is not very reliable. It is highly desirable to have high-speed PCBs built using conventional well-matured dielectric materials such as FR4, with which conventional well-matured fabrication processes can be used. This will reduce manufacturing costs and increase, reliability of the connection systems.

Much work in off-chip interconnection technology focuses on material development. For example, low loss materials like Polytetrafluoroethylene (PTFE), Duroid™, and Rogers 4003® are under development to achieve high bandwidth. Implementing new material in PCB fabrication processes will be very expensive (more than ten times conventional solutions) to mature the technology. In addition, new materials with low loss tangents will be incompatible with conventional processing using dielectric materials such as FR4, so is not a low-cost solution. These materials will require a much higher temperature and pressure for lamination. Today, in high-speed PCB development, more focus is on shortening the PCB length or on interconnection layout. Both shortening PCB length and improving interconnection layout will be.

As explained above, conventional PCB technology must be improved for off-chip interconnection and increasing signal speed. Also, existing conventional electrical interconnects have bandwidth limitations, and it would be very expensive to completely change PCB manufacturing technology to suit higher-bandwidth needs. It is highly desirable to lower the dielectric constant and dielectric loss of PCBs by adopting a technique or method which can be easily implemented, and which uses conventional dielectric materials and PCB technology.

SUMMARY OF INVENTION

Accordingly, it is an objective of the invention to provide a technique to reduce the effective dielectric constant and effective dielectric loss of the interconnection system in order to increase the bandwidth of interconnection systems for high-speed PCBs.

Accordingly, it is an objective of this invention to use an inhomogeneous dielectric system to reduce the effective dielectric loss and dielectric constant of the interconnection system.

According to the invention, it is an objective to provide an interconnection structure where a large portion of the (electromagnetic wave) is allowed to pass through air or the dielectric material, causing less dielectric loss than that of the base dielectric material on which the signal line is laid out.

It is an objective of this invention to provide the manufacturing process of the high-speed PCB carrying the high-speed signal lines.

Another objective of the present invention is to provide the interconnection structure for chip-to-chip (off-chip) interconnection in the PCB, which is compatible to available PCB technology.

According to the invention, the high-speed PCB for off-chip interconnection comprises: (i) single or multiple electrical signal lines for carrying electrical signals from one electronics elements to another and vice-versa for electrical communication; (ii) single or multiple dielectrics which are stacked by prepreg (epoxy) wherein the dielectric system carrying the signal lines has back slots or open trenches having depth deep and width, and located under the signal line (conductor); (iii) a ground or power line located on the side opposite of the dielectrics wherein the shape of the back-slot or trench could be one selected from a rectangle, a square, a circle, and any other shape that is convenient for manufacturing, and the width of the back-slot or trench may either be the same, less or more than the width of the metal conductor carrying the signal.

According to this invention, the signal line of microstrip line type configuration has one open trenches under the signal lines, and the signal lines with a strip-line configuration have the opened trenches located on the top and bottom dielectric layers.

According to this invention, the interconnection system can be a transmission line configuration such as co-planar type, microstrip-type, strip-line type, or any combination thereof.

According to this invention, it is our objective to provide the structure of the open trenches under the signal lines of the high speed PCB. According to the invention it is an objective to provide a via structure to connect the multiple layers of high-speed PCB from a manufacturing point of view, with impedance as an important consideration of view.

According to this invention, the high-speed PCB construction process comprises the steps of: (i) forming single, or multiple core layers having a copper layer only on one side; (ii) making the signal lines in the copper layer on one surface of the single or multiple core layers; (iii) opening trenches in the single or multiple core layers on opposite side of the signal lines, wherein the trench depth is determined from the bandwidth required for the interconnects and the trench width can be selected based on manufacturing convenience and the interconnection bandwidth requirement; (iv) forming prepreg (epoxy) to stack multiple core layers to make a multi-layered PCB; (v) hot pressing and laminating for stacking the sheets, and; (vi) sintering at a high temperature suitable for curing and bonding multiple core layers.

According to this invention, the process for a PCB having the signal line of microstrip line configuration comprises: (i) a first core layer formation having a copper layer on only one side; (ii) making the signal lines in the first core layer; (iii) opening the trenches on opposite sides of the signal lines located on the first core layer, wherein the trench depth is determined from the bandwidth required for the interconnection system and the trench width can be selected based on manufacturing convenience and the interconnection bandwidth requirement; (iv) formation of the prepreg (epoxy) layer for stacking multiple core layers to make microstrip type signal lines in the PCB; (v) formation of a second core layer having copper layer on only one side of the core layer; (vi) hot press and lamination for stacking the first core layer, prepreg layer, and a second core layer with a uniform copper layer, and; (vii) sintering under the appropriate temperature.

According to this invention, the process for making a PCB having a signal line of strip line type configuration comprises: (i) a first core layer formation having a uniform copper layer on only one side; (ii) making the signal lines in the first core layer; (iii) opening the trenches on the opposite side of the signal lines located on the first core layer, wherein the trench depth is determined from the bandwidth required for the interconnection system and the trench width can be selected based on manufacturing convenience and the bandwidth requirement of the interconnection system; (iv) a second core layer formation having a uniform copper layer on only one side; (v) opening the trenches on the opposite side of the uniform copper layer (of second core layer), wherein each trench position is the same as that of the trenches made in the first core layer and the trench depth is determined from the bandwidth requirement of for the interconnection system and the trench width can be selected based on manufacturing convenience and the bandwidth requirement of the interconnection system; (vi) a third core layer formation having a uniform copper layer on only one side of the core layer; (vii) formation of two prepreg (epoxy) layers to stack multiple layers to make microstrip line type signal lines on the PCB; (viii) hot press and lamination to stack the second core layer with trenches, prepreg, first core layer, prepreg layer, and the third core layer, and; (ix) sintering under temperature.

According to this invention, the electrical signal line could be a microstrip type or strip line type or coplanar type waveguide.

According to the invention, the open trenches or backside slots can be filled with a dielectric material with a lower dielectric loss than the dielectric material on which the signal line lies.

Alternatively, according to the invention, the trenches or backside-slots of the dielectric system can be filled with air or made a vacuum.

According to the invention, alternatively, the trenches or back slots of the dielectric system can be filled with liquid crystal material, which allows for tunability of the dielectric constant and dielectric loss of the system.

According to this invention, the open trench or backside slot can be filled with a coolant to cool the PCB.

According to this invention, high-speed communication is made possible between two or more than two electrical or optical elements where electrical, optical or both electrical and optical signals are used for transmission through the interconnection system. According to this invention, the effective loss tangent and effective dielectric constant of the dielectric system is reduced, which reduces the microwave-loss and increases the interconnection bandwidth for high-speed electrical signal propagation, and reduces the signal propagation delay. The closer the microwave loss is to zero, the closer to be the electromagnetic wave to the speed of the light.

This invention offers a method of fabrication for the high-speed PCB (which can be used to connect the signal lines of two or more chips so that they can communicate without sacrificing inherent signal speed. The high-speed interconnection system embedded into the PCB can be easily fabricated using conventional PCB manufacturing technology. The methods described in this disclosure enable one to make the electronics interconnection system for inter-chip connection in a cost-effective manner suitable for practical application.

Another objective of this invention is to reduce microwave loss so as to minimize signal skew in the interconnection system which is caused by signal propagation delay.

Other objectives, features, and advantages of the present invention are apparent from the drawings and the corresponding detailed description below.

BRIEF DESCRIPTION OF DRAWINGS

The invention will be explained in more detail in conjunction with the appended drawings.

FIG. 5A reveals the second preferred embodiment, with only a microstrip line configuration. FIG. 5B reveals the third preferred embodiment, with only a stripline configuration.

FIGS. 10A and 10B show the top view of the signal lines on the high-speed PCB, according to this invention. The transition of signal lines layout is shown, which is important for manufacturing and keeping the impedance constant along the signal line to via.

FIGS. 17A is the top-view and FIGS. 17B and 17C are the side and front cross-sectional views, respectively, taken along AA' and BB' of FIG. 17A, illustrating the mountable/stackable interchip (off-chip) interconnections consisting of the multilayered high-speed PCB in the first preferred embodiment according to the present invention.

DETAILED DESCRIPTION OF THE PREFERRED EMBODIMENTS

Figure 1:
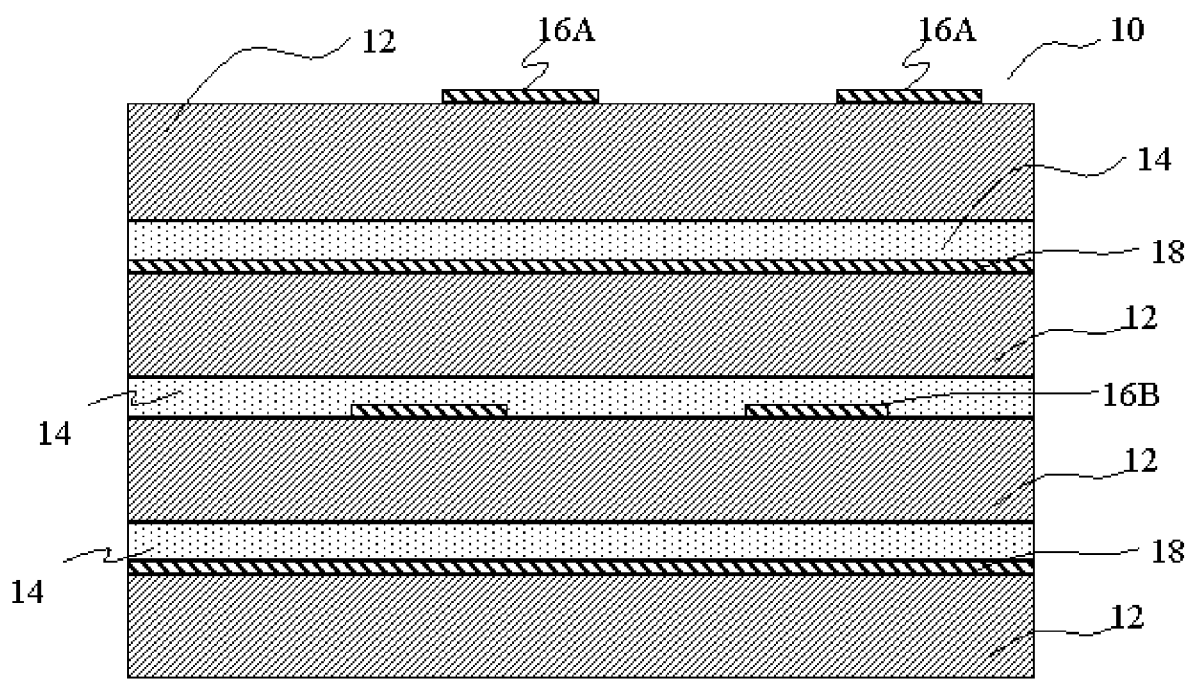
FIG. 1 is the cross-sectional view showing the prior art of the PCB used for electrical connection of two or more chips. For simplicity, an enlarged cross-sectional view of a multilayerd PCB is shown.

The best modes for carrying out the present invention will be described with reference to the corresponding drawings. In the following description, the same reference numerals denote components having substantially the same functions and arrangements, and duplicate explanations will be made only where necessary.

An important point of the high-speed PCB with high-speed electrical interconnects according to the present invention is that the microwave loss is to be reduced by reducing the effective loss tangent, resulting in increased bandwidth of the interconnects and an interconnection signal-speed closer to the source speed. Another important point is that the technique is to be cost-effective, and compatible with standard manufacturing technology.

In an interconnections system connecting two or more electronics elements (e.g., two or more chips), the signal can be conveyed electrically through the wire (electrical conductor) laid on the dielectric medium. For high-speed signal transmission, the electrical conductor should be a transmission line of microstrip or strip line type. The signal speed in the interconnection system (i.e. bandwidth of the interconnection system) is mainly dominated by (a) signal conductor parameters including (i) length and (ii) thickness; and (b) dielectric material properties including (i) dielectric constant and (ii) loss tangent. A longer interconnection length will increase capacitance by $A\cdot\varepsilon\cdot L/d$, where A is the area of the signal conductor, $\varepsilon$ is the dielectric constant of the material, L is the length of the signal conductor, and d is the thickness of the dielectric material. With an optimized design, capacitance is mostly limited by the dielectric constant. As frequency increases, the signal will attenuate due to the skin effect. Consider Cu at 100 GHz with a skin-depth $(\delta)=0.2$ $\mu m$. For comparatively lower frequency, this skin-depth is negligible. Therefore, bandwidth of the interconnection system is mainly dominated by the dielectric material properties such as the dielectric constant and loss tangent. For increased bandwidth, the values for the dielectric constant and loss tangent should below.

It is very straight forward that increasing the bandwidth of the interconnection system is possible by using of the low dielectric loss material in off-chip interconnects. However, new materials are needed and manufacturing technologies need to be developed to implement new materials into high-speed PCB fabrication.

It is highly desirable to have a low effective dielectric loss and low dielectric constant. The high-speed PCB with the interconnection system embedded therein can be fabricated using conventional manufacturing technology.

First the structure of the high-speed PCB along with the techniques to reduce the effective dielectric constant and dielectric loss will be explained, followed by an explanation of the fabrication process and some design estimations based on conventional dielectric materials such as epoxy-glass dielectrics.

Figure 4:
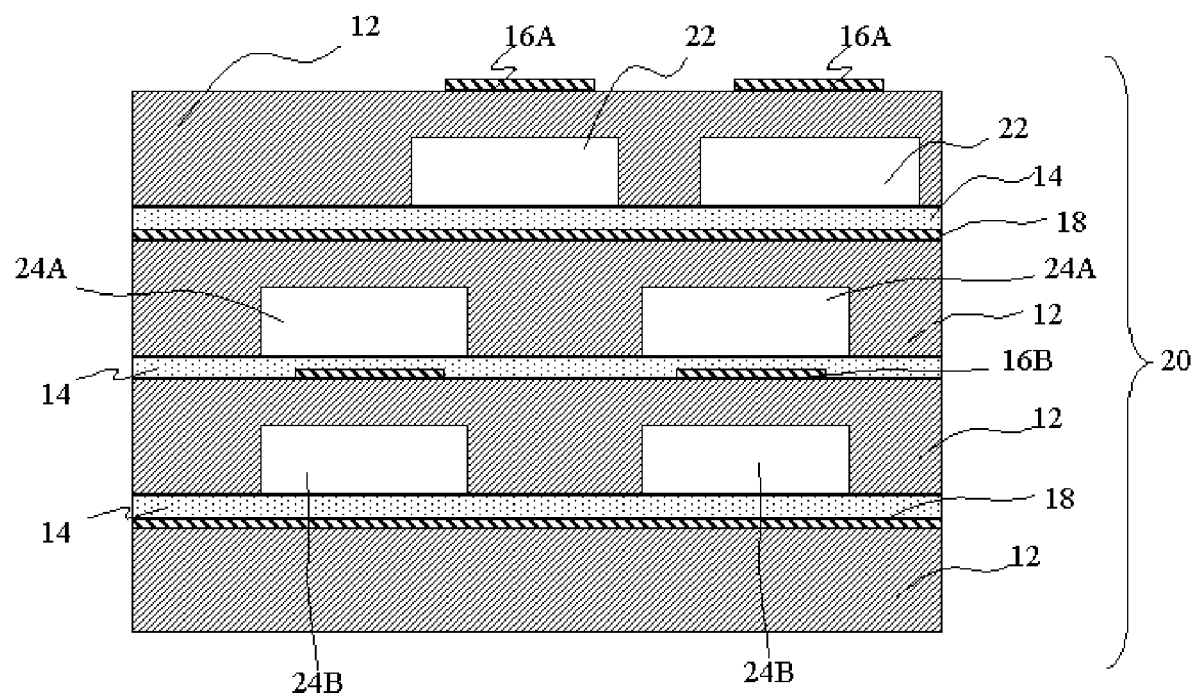
FIG. 4 is the cross-sectional view showing the high-speed PCB used for off-chip interconnects in the first preferred embodiment according to the present invention, where there are both microstrip line and stripline configurations in the multilayered PCB. For simplicity, an enlarged cross-sectional view of a multilayered PCB is shown.

(a) High-Speed PCB Structure:

FIG. 4 is the cross-sectional views of the portion of the high-speed PCB in the first preferred embodiment in accordance to the present invention, wherein like parts are indicated by like reference numerals used previously, so that a repeated explanation is omitted here. The high-speed PCB 20, as shown in FIG. 4, consists of four layers of dielectric core 12 out of which two layers are for laying the signal lines 16A and 16B, and two layers contain the ground plane 18 (that could be used as a power plane or ground). These four core layers with signal lines and ground planes are stacked together to form the multilayered PCB 20 by using two layers of prepregs 14 between the connected core layers. Signal line 16A is microstrip type signal line and signal lines 16B is a stripline type signal line. According to this invention, in high-speed PCB 20, the signal lines 16A and 16B have lower dielectric loss and lower dielectric constant than the homogeneous dielectric 12 because the trenches 22, 24A, or 24B are underneath or above the signal lines 16A and 16B. The signal line 16A of microstrip type has one trench 22 under the signal line. Signal line 16B of stripline type has two trenches-24A is in the dielectric layer above the signal line 16B and 24B is in the layer below the signal line 16B. According to this invention, the effective dielectric loss (loss tangent of dielectric system) can be reduced and the signal attenuation during propagation is reduced. In other words, signal transmission is less dispersive and higher bandwidth of the interconnection system is achieved, as compared with the conventional PCB where the signal conductor is laid onto the uniform dielectric medium, as shown in FIG. 1. Less cross talk is also expected as the effective capacitance is decreased. Based on the design, a significant portion of the electromagnetic wave can pass through the open-trench 22, 24A or 24B. The width of the trench can be adjusted based on the signal line width, i.e., the trench width can be widened as the signal line width is widened. The signal line impedance can be controlled by changing the properties of the trench, the dielectric layer thickness, and the signal line width. According to this invention, the open trenches can be filled with the air or dielectric material (not shown) having a lower dielectric loss than the dielectric core material 12.

For simplicity, in FIG. 4, the open trenches 22, 24A, 24B are shown in close proximity to prepreg 14 and ground 18. Alternatively, according to this invention, these trenches could be made at the center of dielectric 12, in close proximity to the signal lines 16A, 16B, the prepreg 14, or the ground 18. In FIG. 4, the trench-widths are shown to be wider than the signal lines 16A, and 16B. The trench-width can be the same width or a smaller width than the signal line width, and it can be selected based on the bandwidth requirements of the interconnection system.

Figure 5A:
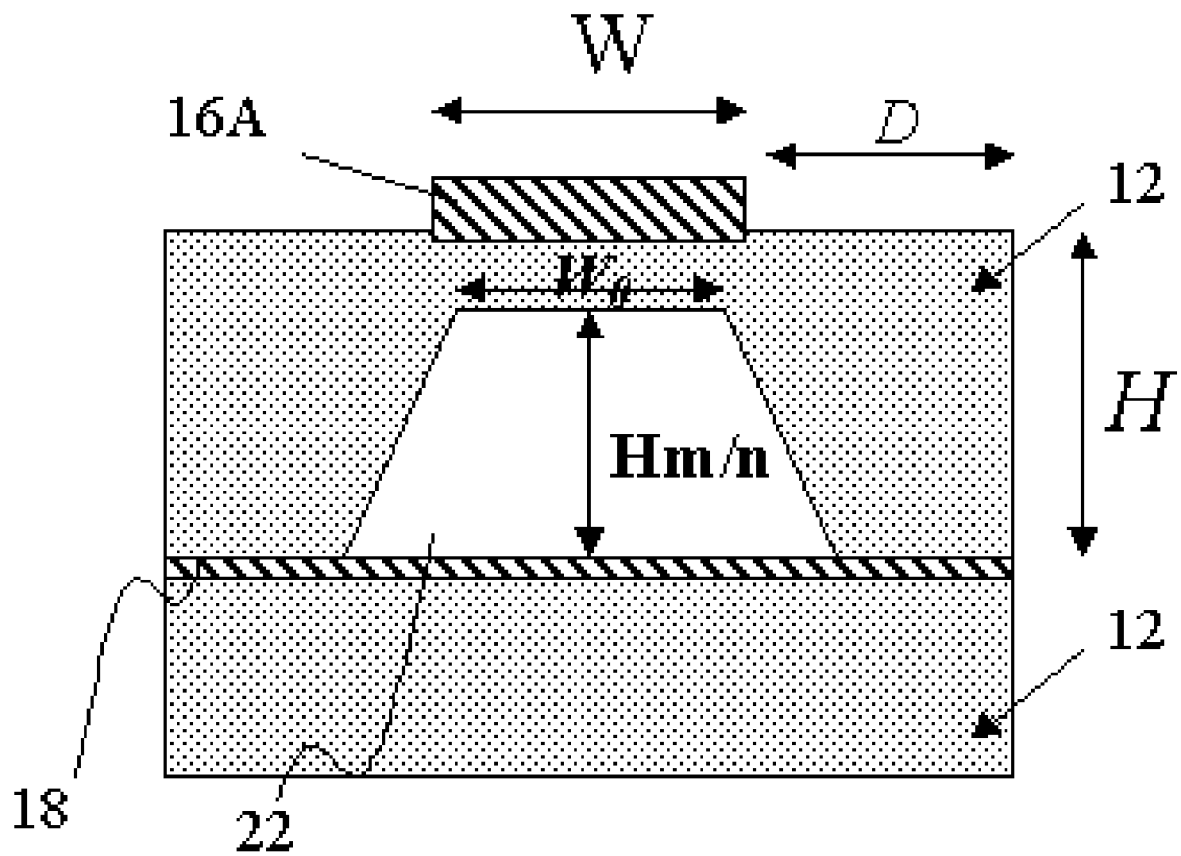
FIGS. 5A and 5B are the cross-sectional views showing the electrical signal lines embedded into the high-speed PCB for off-chip connection in the second and third preferred embodiments of the present invention.
Figure 5B:
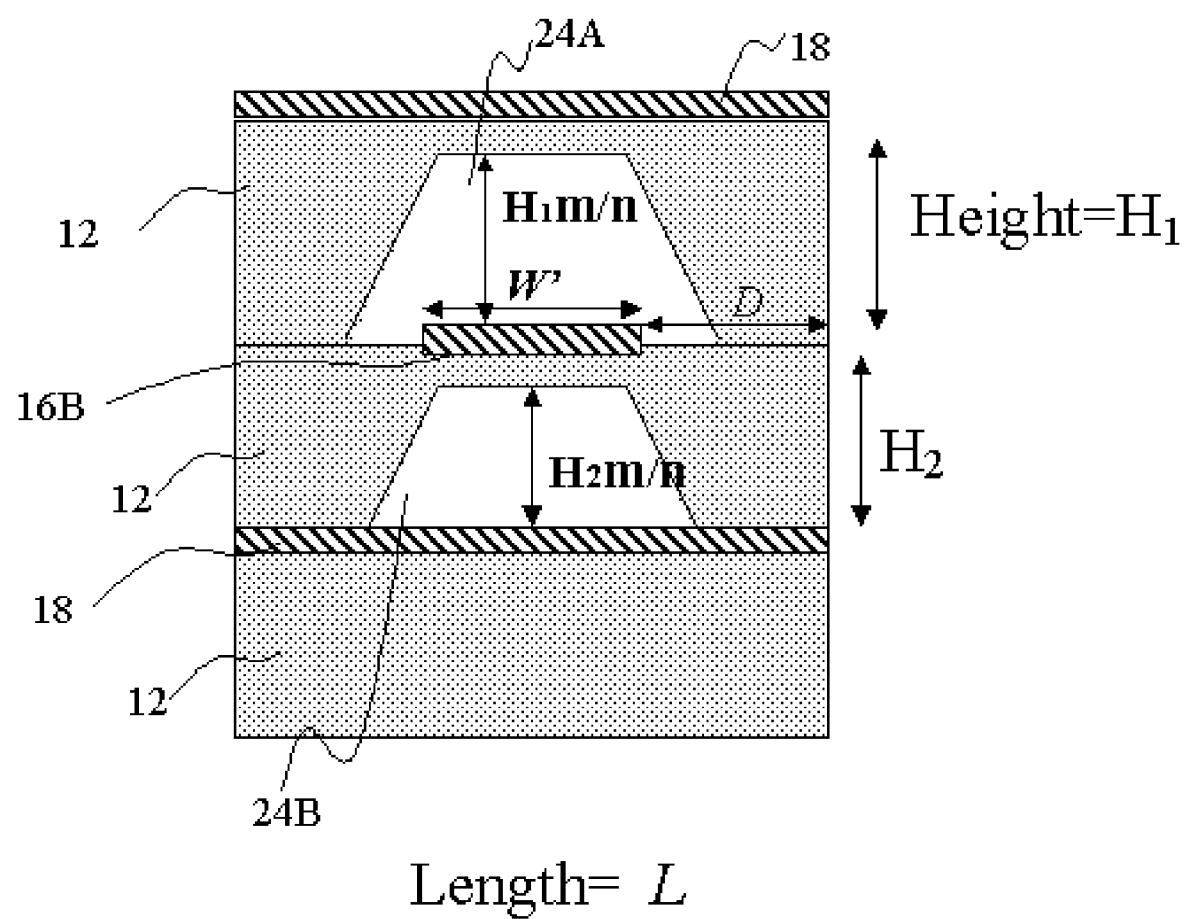
Figure 6:
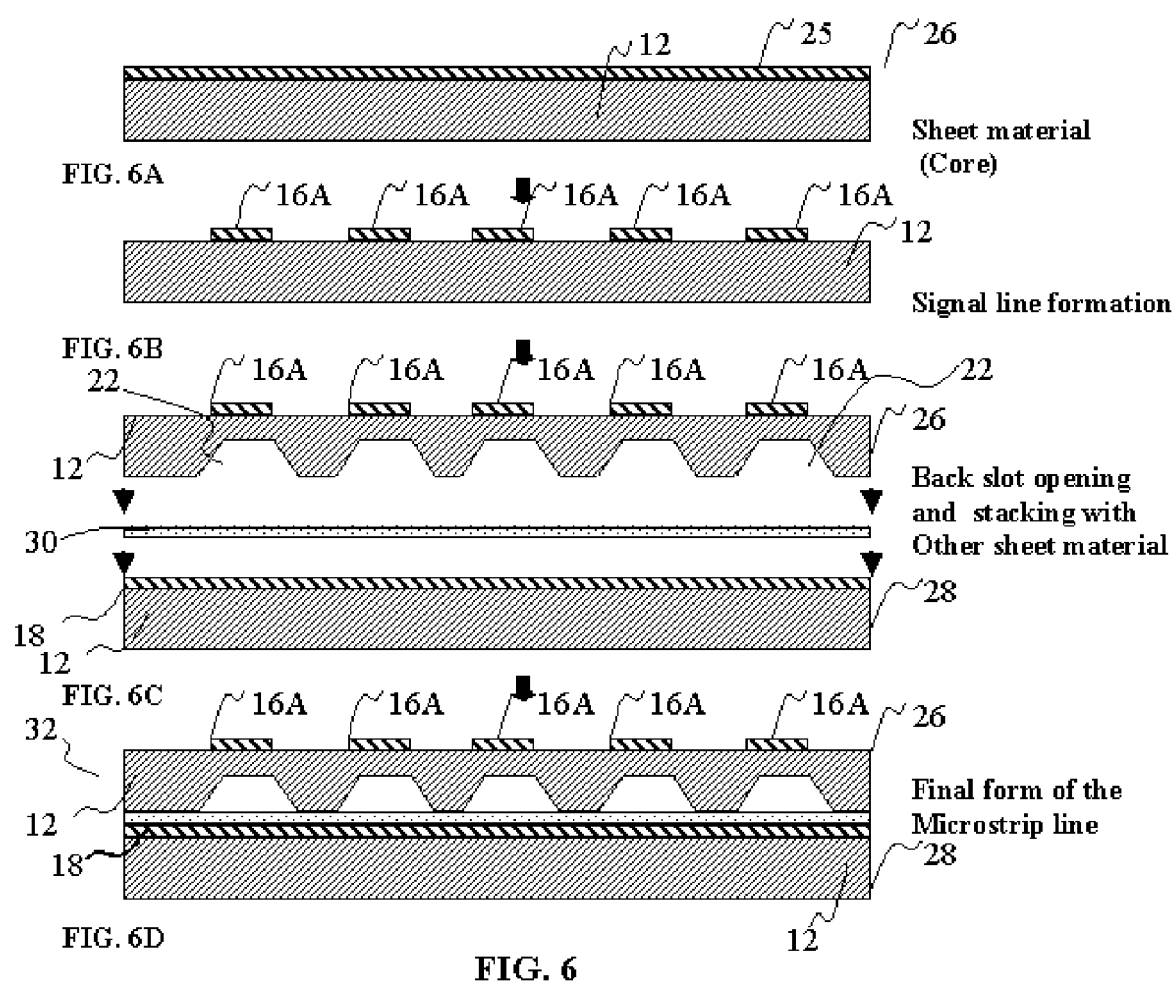
FIG. 6 is the schematic illustrating the fabrication process of the signal line of microstrip line type configuration used in the high-speed PCB in the second preferred embodiment according to this invention.
Figure 7:
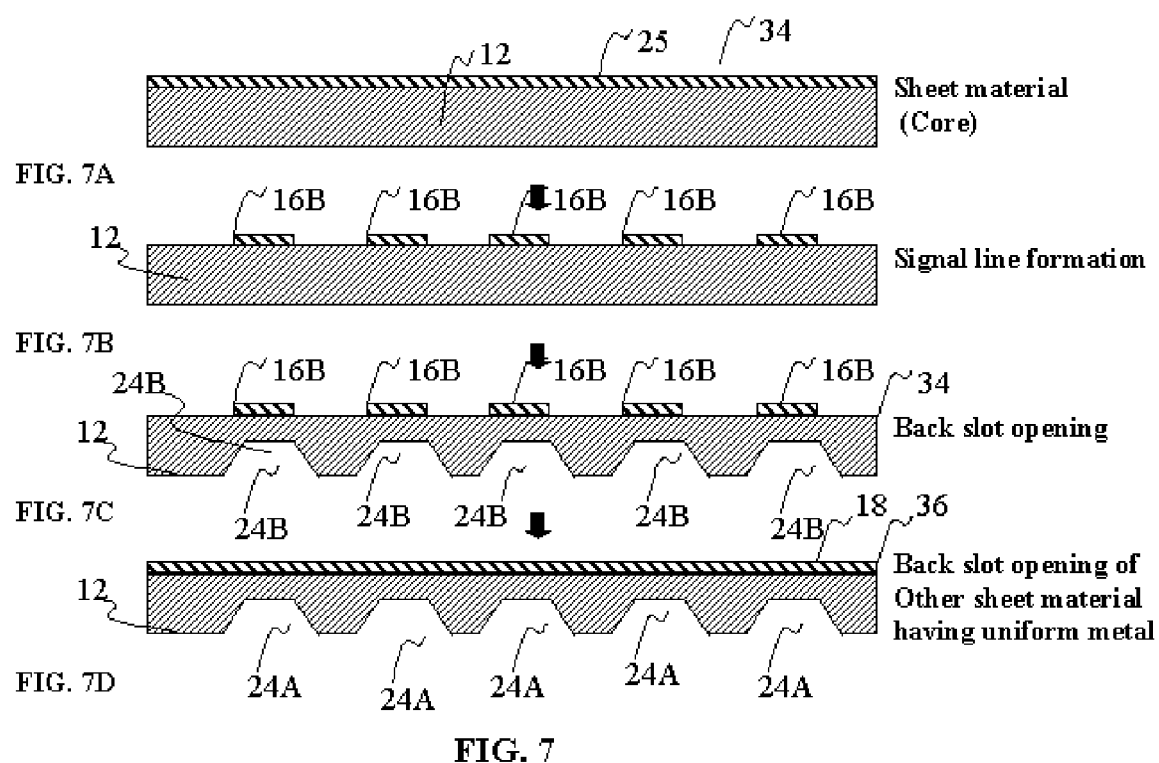
FIG. 7 is the schematic illustrating the fabrication process of the signal line of stripline type configuration used in the high-speed PCB in the second and third preferred embodiments according to this invention.

FIGS. 5A and 5B are the cross-sectional views of the portion of the signal lines of microstrip type and stripline type configurations, respectively, in the second and third preferred embodiments in accordance to the present invention, wherein like parts are indicated by like reference numerals as used in FIG. 4, so that repeated explanation is omitted here. In FIG. 5A, the signal lines 16A, with width W and length L, is microstrip type signal line consisting of two layers of the core layers 12, in which the top layer 12, with height H, has the signal lines 16A and opened trench 22, with top width $W_0$ and height H*m/n, where m and n are positive integers and m is less than or equal to n, under the signal lines and the bottom dielectric layer (core) 12 has the uniform metal layer 18 which acts as the ground in the microstrip type signal line 16A. D represents the distance from the edge of the signal line to the edge of the substrate. In FIG. 5B, the signal line 16B, with width 'W', is a stripline type signal line and it consists of three layers of dielectric cores 12, in which the top core layer 12, with height, $H_1$ has ground 18 and open trench 24A with height $H_1$*m/n; the middle core layer 12, with height $H_2$ has signal line 16B and open trench 24B, with height $H_2$*m/n (where m and n are positive integers and m is less than or equal to n), aligned with signal lines 16B; and the bottom core layer 12 has metal ground layer 18. These three layers are stacked together to form the stripline type signal lines. Note that for each separate open trench, the positive integers m and n may be varied. According to this invention the effective dielectric loss and dielectric constant (i.e., the microwave index) are considerably decreased as mentioned above. The explanation for achieving high bandwidth was explained above in conjunction with FIG. 4, so that explanation is omitted here.

According to the invention, based on the interconnect structure design, the effective dielectric loss and effective dielectric constant of the interconnect system can be controlled. This helps to add many valuable features to the interconnection system, such as variable phase velocity (which is function of the dielectric constant), variable bandwidth of the interconnection system; variable signal skew, etc. According to the present invention, ideally, the speed of the signal in the signal line can be made to match the speed of the light in the air if other loss due to the signal line structure are neglected, such as the loss attributable to electrode parameters including resistance and capacitance. The bandwidth of the electronic interconnect system can be made closer to the speed of light or greater than speeds attained using optical fiber. In the figures, the dielectric system consisting of a the backside open trench or backside slot is considered. This invention covers all high-speed PCBs in which embedded signal lines are used; such PCBs are useful for off-chip interconnects.

According to this invention, the high-speed PCB can be designed using a single or multiple dielectric layers with backside open trenches or slots under the high-speed signal line. For simplicity, FIG. 4 reveals a four-layered-PCB with two signal lines layers and two ground layers. However, the present invention includes all high-speed PCBs having one or more layers with open trenches or slots under the signal line to increase the bandwidth of the interconnection system.

According to the present invention, it is our objective to control the propagation of the electric field significantly inside the trench or slot (by filling it with air or a low-loss and/or a material with a low dielectric constant which thereby increases the bandwidth of the interconnection system and reduces signal propagation delay. In the preferred embodiments, as explained above in conjunction with FIG. 4 and FIGS. 5A, 5B, the strip-line and microstrip line configuration with one or more signal lines are shown to explain the inventions. This invention also covers other types of signal transmission lines having different configurations such as coplanar single-ended or differential-ended signal transmission lines. Coplanar transmission line(s) that are well known in the art comprise one or more additional ground line(s) constructed coplanar at a fixed spacing, along the length of a signal line. In a single-ended coplanar transmission line there is only one such additional ground line on one side of a signal line, whereas in a differential-ended coplanar transmission line there are two such additional ground lines, one on each side of the signal line. Notably, the width of the additional ground line(s) and the spacing between the ground line(s) and the signal line control the transmission properties in the signal line.

In the preferred embodiments, the dielectric layer may include any material with dielectric properties that are compatible with PCB construction. These dielectric materials can be made using high temperature ceramics processing methods or the IC fabrication process that are compatible with PCB construction. A wide range of dielectric materials including ceramic materials, glass including epoxy glass and fiber glass laminate materials, and polymers including polyimides are well known to those skilled in the art, and are readily available under various Trademark names. For example, suitable ceramic materials and low temperature cofired ceramic materials include AlN, $Al_2O_3$, Mullite $3Al_2O_3:2SiO_2$), SiC, $SiO_2$, Silicon nitride, silicon carbide, Silicon-Oxy-Nitride, BeO, Cordierite (magnesium alumina silicate), and BN. Glass (with different compositions), including CaO, MnO, ZrO2, PbO, alkali-halide (e.g. NaBr, NaCl etc.) and some commonly known epoxy glass, and epoxy glass composites available under the Trademark name Duroid™ and FR4™, respectively, are considered suitable for constructing PCB. The most common polymer dielectric materials suitable for PCB construction known in the art, include but are not limited to, PTFE under the Trademark name Teflon™, liquid crystal polymer, epoxy, parylene, silicone-polyimide, silicone-gel, fluorinated ethylene propylene copolymer, elastomers (e.g. silicone elastomer), monomers, and gels. Other polymer dielectric materials include polyimides and benzocyclobutenes (BCBs). The commonly known polyimide for PCB construction is available under the Trademark Q-PILON™ and Kapton™. All polymers listed here are readily available from manufacturers well known to those skilled in the art including DuPont, Hitachi-Chemical, Mitsui, and Mitsubishi-Chemical. Gore-Tex in Japan markets liquid crystal polymer. Polymers like Q-PILON™ and Kapton™ polyimide films are marketed by Pi R&D in Japan, and DuPont, respectively.

In the preferred embodiments, as explained in conjunction with FIGS. 4, 5A, and 5B, dielectric systems with backside open trenches in the dielectric layer are considered. The open trenches could be filled with any dielectric material having a lower dielectric loss and/or a lower dielectric constant than the dielectric core layer 12. Air or a vacuum can be used to fill the open trenches. Alternatively, the open trenches or slots can be filled up completely by liquid crystal material or the walls of the open trenches or slots can be coated by liquid crystal material. The electric field can change the orientation of the liquid crystal and can be used to control the effective dielectric constant and dielectric loss of the dielectric system. This could also provide for a tunable effective dielectric constant and effective loss of the dielectric system.

According to the present invention, the high-speed PCB is made using dielectric systems which have a lower effective dielectric loss and dielectric constant. The preferred embodiments have many different applications. For example, the preferred embodiments can primarily be used for high-speed PCBs with interconnects for connecting multiple high-speed multiple ICs. The application of the present invention in such PCBs includes, but is not limited to, (a) off-chip interconnects, for example, for connecting two or more electronics chips on the PCB, (b) high-speed chip (die) packaging, and (c) high-speed electrical multi-channel ribbon-type flex PCB for connecting multiple electrical modules, for example, board-to-board interconnection, rack-to-rack interconnection, etc.

In the preferred embodiments, as explained below, the high-speed PCB manufacturing process is explained in order to illustrate manufacturability using conventional manufacturing processes. According to the invention, the manufacturing techniques described here are only an example of some of the available techniques which can be used to reduce the microwave loss and dielectric constant, increase the bandwidth, and reduce the signal propagation delay. The design estimation is also included to show the reduction of the effective dielectric constant and effective dielectric loss and the significant improvement of the interconnects bandwidth. It should be noted here that based on the dielectric removal, the bandwidth of the interconnects embedded into the high-speed PCB can be controlled.

(b) High-Speed PCB Process and Design:

Before explaining the fabrication process of the multilayered high-speed PCB with embedded high-speed signal lines mentioned above, we explain the fabrication process for the two main signal lines, which are microstrip type signal lines and strip line type signal lines. The multilayered high-speed PCB may have one or more layers of such signal lines embedded in the PCB.

(i) Fabrication Process for Microstrip Line Type Signal Lines

FIGS. 6A, 6B, 6C, and 6D are steps for the process of building the high-speed PCB with microstrip type signal lines in the second preferred embodiment of the present invention, wherein like parts are indicated by like reference numerals, so that a repeated explanation is omitted here. Enlarged cross-sectional views of a portion of the high-speed PCB are shown for explanation. In the preferred embodiment, the process for the high-speed PCB having only microstrip lines type signal lines consists of signal lines 16A formed from uniform metal layer 25 of the sheet material 26, opening the trenches 22 under the signal lines 16A, and stacking the signal lines 16A and the dielectric layer 12 with the other sheet material 28 having one side which is a uniform metal layer acting as the ground 18. The stacking can be performed using the resin (prepreg) 30 to form the multilayered high-speed PCB 32 having microstrip line type signal lines. The trenches 22 can be opened inside the sheet material 26 by using laser drilling or mechanical drilling. With laser-drilling, commercially available carbon dioxide ($CO_2$) lasers, Nd:-YAG lasers, Excimer lasers, or ultra-violet (UV) laser with variable optical arrangements can be used. The depth of the trench (Hm/n in FIGS. 5A, and 5B where m and n are integers) can be controlled by adjusting laser intensity and pulse width of the laser illumination. Adjusting the optics of the system can control the width. The laser technology has matured so much that today, making vias or microvias takes minimal time. Several companies such as Siemens™, GmbH & Co. KG of Germany, and Electro Scientific Industries, Inc.™ of Portland Oreg., USA market the UV, $CO_2$ laser instruments, which can form microvias at high speeds. For example, a $CO_2$ laser marketed by Siemens™ of Germany can make >30,000 vias per minute with 75 to 200 μm diameters in conventional FR4 (epoxy resin-glass) PCBs. In that process, it takes more time for the lasers to shift from one via to other than it does for the actual drilling. According to this invention, similar laser drilling technology can be used to open the backside open trench, which is an additional necessary process in the high-speed PCB buildup process for the present invention. It will take less time for continuous drilling according to this invention.

According to this invention, conventional dielectrics such as FR4 (epoxy-glass), or other materials frequently used as PCB materials, can be used. In this case, a $CO_2$ laser or YAG laser can be used for drilling to form the open trenches. According to this invention, it is estimated that 160 inches in length and width of line, having a height of 8 mil (about 200 μm), can be made in one minute, which converts to 9600 inches in length and width per hour. It is estimated that for a PCB with 4 layers of 12 inch.times. 12 inch (30 cm.times.30 cm) PCB having eight 12-inch-long-microstrip lines and eight 12-inch-long strip lines, the approximate time to make the trenches using laser drilling would be 1.2 minutes. Electro Scientific Industries, Inc.™ markets a UV via machine that can etch vias at 30,000 vias per minute. This could improve the previous estimation. Aligning can be done using infrared imaging analysis, which shows the metal patterns (signal lines) on the opposite side of the dielectric layer.

Another method of laminate removal is using a milling machine. MITS Electronics™ of, Tokyo, Japan markets a milling machine which can drill through dielectric materials, and is manufactured for use with PCBs.

This machine has control in the X,Y, and Z direction. The z-direction accuracy of this system is 0.1 mils. The instrument available in the market can accomplish PCB drilling automatically based on the trace design. Using the available drilling technology, the high-speed PCB can be fabricated as noted in this invention.

According to this invention, the fabrication process for the microstrip line type signal lines are described. A similar fabrication process can be used for the high-speed PCB that has only a single layer of signal lines of microstrip line type configuration. Other layers can exist for carrying low-speed signal lines. In that case, other layers could be fabricated using uniform dielectrics as conventional PCB fabricates. The high-speed PCB could be hybridly stacked, where one or more layers could contain the non-uniform dielectrics (dielectrics with the open trenches of the present invention).

(ii) Fabrication Process for Stripline Type Signal Lines

FIGS. 7A, 7B, 7C, 7D, 7E, and 7F show the steps for the process of building the high-speed PCB with stripline type signal lines in the third preferred embodiment of the present invention, wherein like parts are indicated by like reference numerals, so that a repeated explanation is omitted here. Enlarged cross-sectional views of a portion of high-speed PCB are shown for explanation.

In the preferred embodiment, the process for the high-speed PCB having stripline type signal lines consists of signal lines 16B formed in the sheet material 34, opening the trenches 24B under the signal lines 16B, formation of the trenches 24A (aligned with signal lines 16B upon stacking) in the sheet material 36 which has a uniform metal layer which acts as the ground 18, and stacking the sheet material 36 with trenches 24A, uniform metal layer 18, sheet material 34 with trenches 24B and signal lines 16A, and a third sheet material 38 with uniform metal layer 18 and uniform core layer 12, with the help of the two prepreg layers 40, to form the multilayered high-speed PCB 42. The stacking can be performed using the resin (prepreg) 40 to form the multilayered high-speed PCB 42 having stripline type signal lines. The related process techniques, for example, the patterning, trenches, and opening techniques, were already explained in accordance with FIGS. 6A-6D, so a repeated explanation is omitted here.

Figure 2:
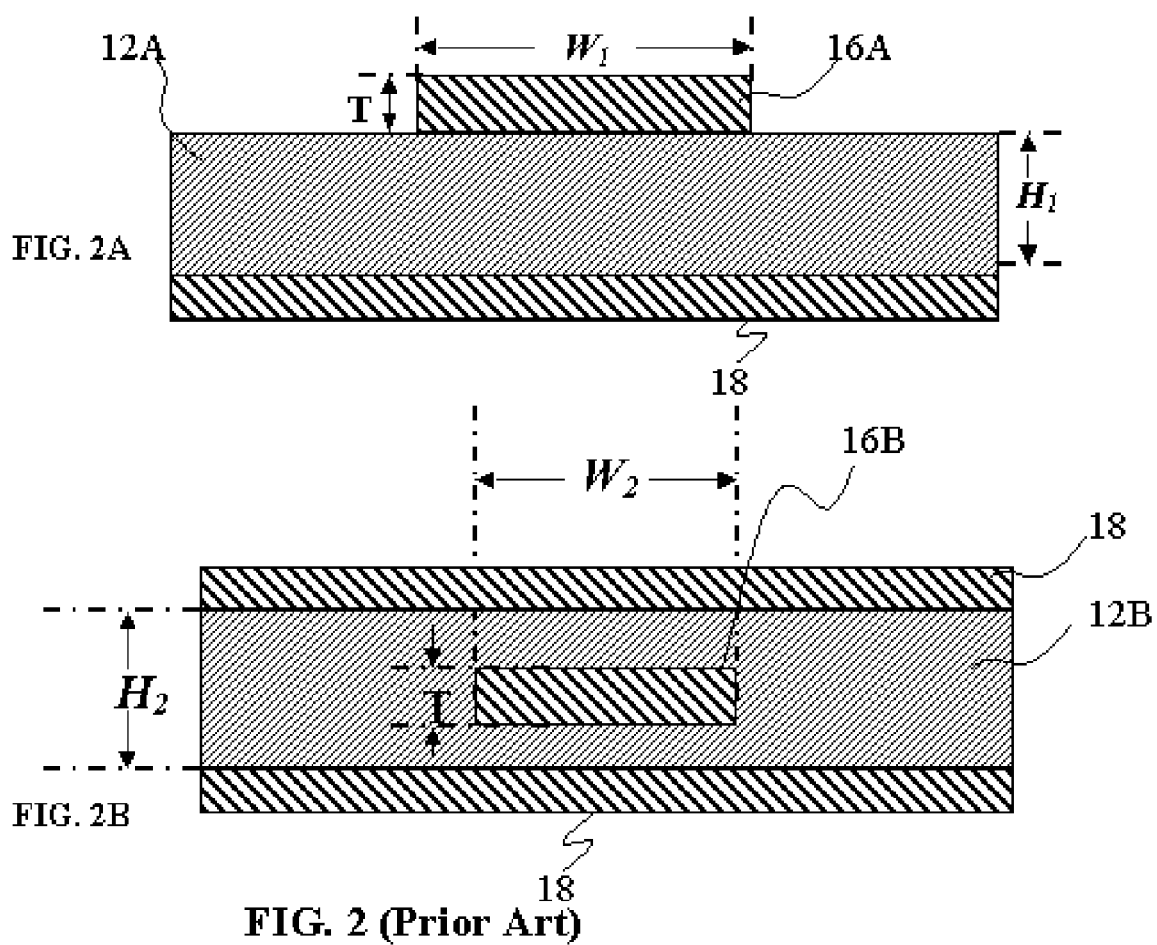
FIGS. 2A and 2B are the cross-sectional views showing prior art of electrical signal lines used in PCBs for inter-chip (off-chip) connection, where $H_1$ and $H_2$ are the respective heights of the dielectric layers, $W_1$ and $W_2$ are the respective widths of the signal lines, and T is the thickness of the signal line.
Figure 3:
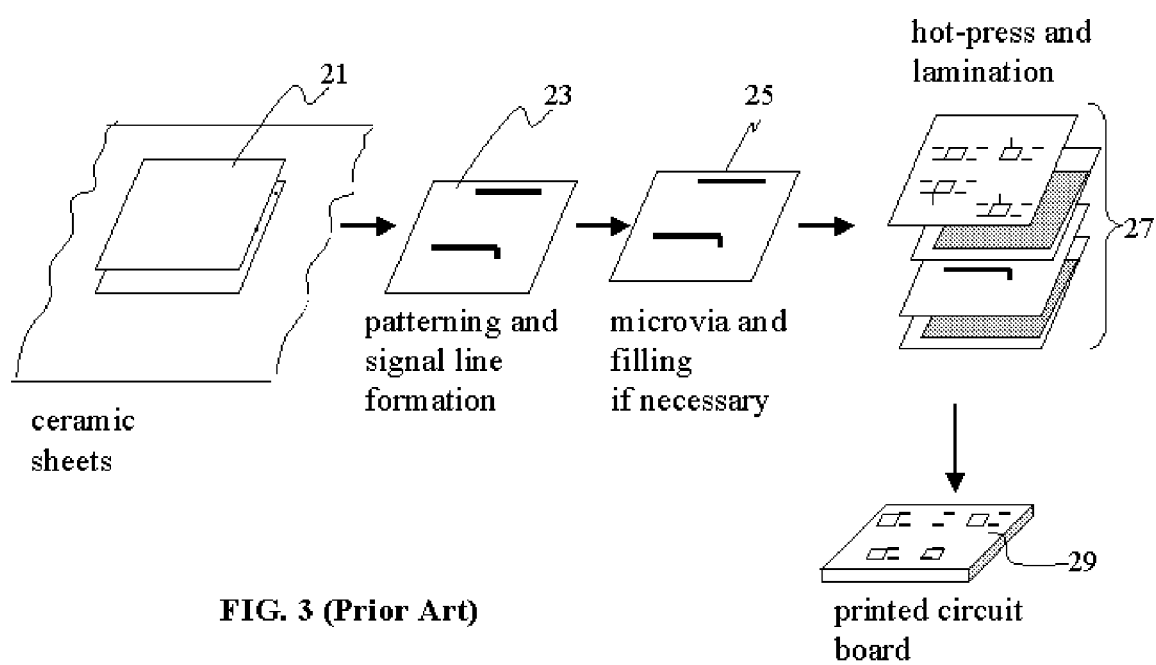
FIG. 3 shows the prior art fabrication process of the PCB.

According to this invention, the fabrication process for the PCB with only stripline type signal lines are described. A similar fabrication process can be used for high-speed PCBs with one or more layers of signal lines of stripline type configuration. Others layers may carry low-speed signal lines, which may consists of uniform dielectrics as described in the Prior Art of FIG. 1 and FIG. 2. The high-speed PCB could be hybridly stacked, in which single or multiple layers could use non-uniform dielectrics (dielectrics with the open trenches of the present invention).

(iii) Process for Multi-Layered High-Speed PCB

In the preferred embodiment as explained below, it is our objective to use the techniques explained in accordance with FIGS. 6A, 6B, 6C, and 6D and FIGS. 7A, 7B, 7C, 7D, 7E, and 7F, in the off-chip interconnects for multiple chip interconnection on the PCB. The board considered here is made from FR4 material or any other dielectric material as mentioned previously. Similar techniques as described below can be applied to other dielectric material as explained earlier.

Figure 8:
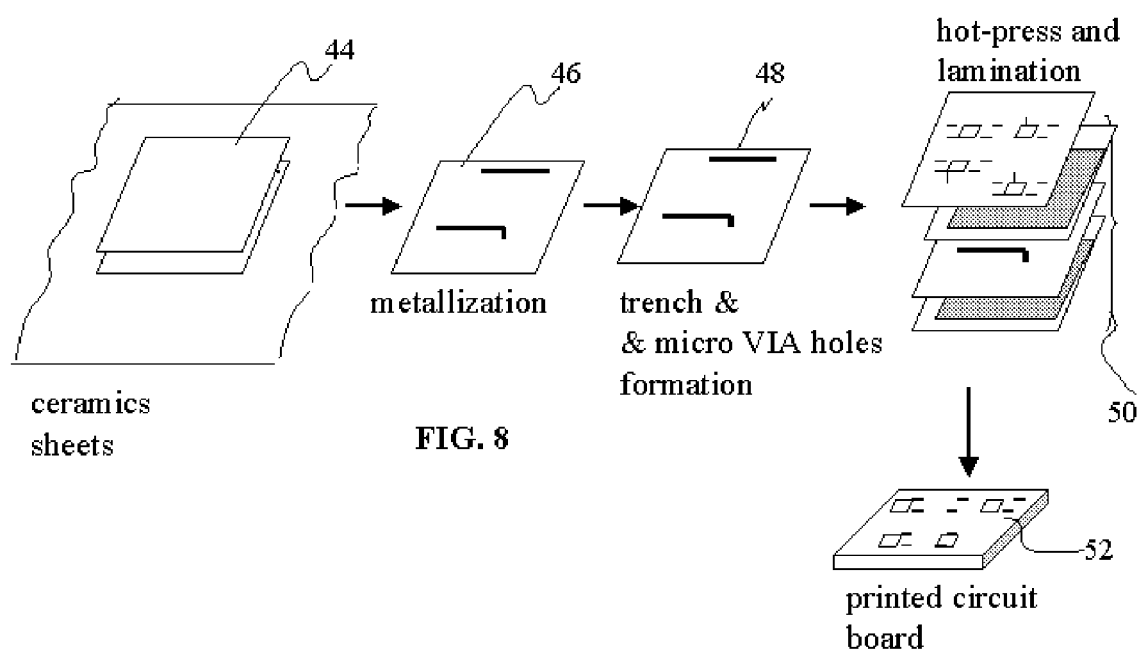
FIG. 8 shows the fabrication process of the high-speed multilayered PCB with embedded high-speed interconnects (signal lines), according to this invention.

FIG. 8 shows the flow-chart of the high-speed mulitlayered PCB fabrication process for the off-chip interconnects in the first preferred embodiment of the present invention, where like parts are indicated by like numerals, so that a repeated explanation is omitted here. The dielectric sheet (not shown) is made using standard PCB fabrication technology such as the slurry casting process. The slurry is cast into about 200 μm to 500 μm thick ceramic sheets with a slip cast process. Each dielectric sheet 44 is a conventional PCB core layer. Metallization sheet 46 is made using conventional PCB technology. After the metallization, the open trench or slot is opened in sheet 48 using processes such as laser drilling, dry-etching, wet-etching (following patterning for etching), or mechanical drilling. Via holes are formed through the dielectric sheet 44 by a punching machine with punches and dies. A ceramic sheet 44 may have more than 10,000 via holes in a 50 μm to 300 μm square area. Low resistivity conductor paste is used on the punch sheet. In this process, via holes are filled with the paste to form the contacts between the signal lines. Low electrical resistivity material such as silver-palladium or gold can be used instead of molybdenum or tungsten refractory materials. The sheets are sintered at high temperature, which lowers electrical resistivity. The trenched sheets 48 are precisely stacked in a pressing die in sequence by the stacking machine. These sheets 50 are laminated together by a hot press. Density heterogeneities in the laminated samples influence any shrinkage in the sintered substrate. Therefore, this lamination process is homogenously carried out by means of the correct dimensional die and punch with flat surfaces. A burn out and sintering process for the multi-layered PCB 52 may be necessary after lamination, at a temperature suitable to the ceramic material used as the sheet 44. Additional via holes processing (not shown) is necessary to connect signal lines located in different layers.

(iv) Via or Micro-Via Structure in High-Speed PCB

In the preferred embodiment as explained below, it is an objective to provide the technique to design the via or microvia in the high-speed PCB, as explained in FIGS. 6A, 6B, 6C, 6D, 7A-7F, and 8. This is one of many techniques, which can be used for the high-speed PCB with high-speed signal lines where open trenches are used to reduce the effective dielectric constant and to reduce effective loss tangent of the interconnects system. Any kinds of PCB materials can be used as the PCB material, such as FR4 and other kinds of dielectric materials mentioned previously.

Figure 9:
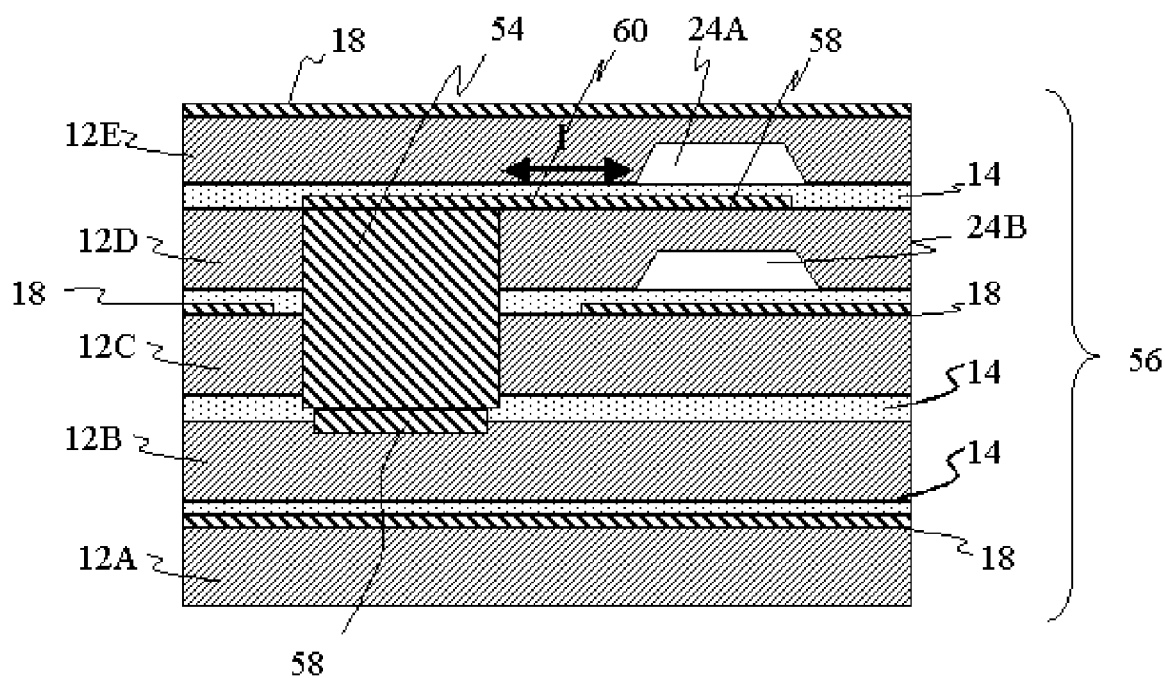
FIG. 9 is the schematic illustrating the structure of the via used in the high-speed PCB, in the third preferred embodiment according to this invention.

FIG. 9 shows an enlarged cross-sectional view of a multilayerd high-speed PCB with the high-speed signal lines and micro-via embedded in the PCB, in the first, second, or third preferred embodiment of the present invention, where like parts are indicated like numerals, so that a repeated explanation is omitted here. According to this invention, via or microvia 54 can be formed without damaging a PCB 56, and it has sidewalls to deposit copper. As shown in FIG. 9, to form the via or micro-via 54, the air-cavities (opened trenches) 24A and 24B must cease at some reasonable distance which depends on design tolerences. The signal line connecting to the via or micro-via 54 consists of two sections, (i) signal line 58 with open trenches and (ii) signal line 60 without open trenches prior to the via or microvia 54. This can be understood more easily by viewing FIGS. 10A and 10B, wherein length '$l_1$' (FIG. 10A) and '$l_2$+$l_3$' (FIG. 10B), respectively, represent distances from the edge of the via or microvia 54 to the edge of the open trench 24A. The impedance of the signal lines 58 and 60 are maintained at the desired impedance by modifying the strip line width (not shown in FIG. 9). In this case, since the signal line 60 has continuous dielectrics, for a fixed characteristic impedance (for example 50 ohm) the width of the signal line 60 is adjusted to be narrower than the width of the signal lines 58 with opened trenches as shown in FIGS. 10A and 10B for clarity. The signal lines 58 and 60, located on core layer 12D, are connected to core layer 12B through the ground layer 18C which is etched back before being stacked as shown in FIG. 9. According to this invention, the via 54 is drilled, lasered, or etched out after core 12A, core 12B, core 12C and core 12D are stacked. After the via is cut, copper is deposited to form the connection of the two signal lines located in two core layers 12D and 12B. Then core layer 12E is stacked to overlap and connect to the via.

FIGS. 10A and 10B show the schematic showing the enlarged top views of the signal line layout which is connecting to the via or microvia in the multi-layered high-speed PCB with the high-speed signal lines and the micro-via embedded into the PCB, in the first, second, or third embodiment of the present invention, wherein like parts are indicated by the like numerals, so that a repeated explanation is omitted here. According to this invention, signal lines consisting of signal lines 58 and 60 (located on the surface 62) may have a transition region 64, as shown in FIG. 10B with transition length '$l_3$'. Without a transition region, the length of the signal line 60, which is not surrounded by an open trench, is '$l_2$', as shown in FIG. 10A. With a transition region, the length of the signal line 60 is '$l_2$' as shown in FIG. 10B. The transition of the signal lines 58 with open trenches 24A, and 24B underneath, to the signal lines 60 without open trenches underneath, prior to the via 54. For smooth transition without reflection of the signal, the transition length '$l_3$' is used. The shape of the transition region could be trapezoidal, circular, or ellipsoidal (not shown). The transition region helps to maintain constant or near-constant impedance for the entire length of the signal line.

Figure 11:
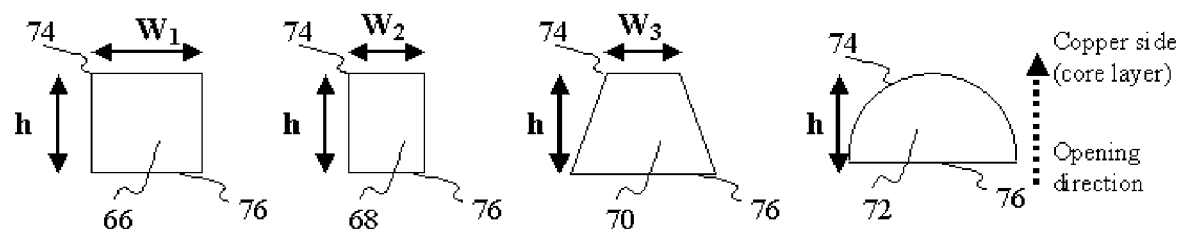
FIG. 11 shows the shape of the open trenches under the signal lines used in the high-speed PCB, according to this invention.

FIGS. 11A, 11B, 11C, and 11D show possible shapes of the open trenches in the core layers of the high-speed PCB in the first, second, or third preferred embodiments of the present invention, wherein like parts are indicated by like numerals as shown in the previous figures, so that a repeated explanation is omitted here. Referring now simultaneously to FIGS. 4, 11A, 11B, 11C and 11D the trenches 22 or 24A shown in FIG. 4 are depicted as openings 66, 68, 70 and 72 in FIGS. 11A, 11B, 11C and 11D, respectively. The dotted arrow shown on the right side of FIG. 11D indicates the direction of the trench openings ("Opening direction" in FIG. 11D) within the core layer towards the metal side (copper side) of the core layer, for example towards the signal line or the ground plane shown in FIG. 4. According to preferred embodiment, the opening can be square in shape 66 as shown in FIG. 11A, rectangular in shape 68 as shown in FIG. 11B, trapezoidal shape 70 as shown in FIG. 11C, circular in shape 72 as shown in FIG. 11D, or ellipsoidal in shape (not shown), where the top opening 74 can be wider or similar to the bottom opening 76. Note here that the top opening 74 is closer to the metal line (signal line or ground) than the bottom opening 76. The widths '$W_1$', '$W_2$', and '$W_3$' of the top openings 74 can be the same or wider than the bottom openings 76. The widths '$W_1$', '$W_2$', and '$W_3$' as shown in FIGS. 11A, 11B, and 11C could be smaller, the same, or larger than the corresponding signal line widths (not shown). In the case of the ellipsoidal (not shown) or circular shaped openings 72, the width of the bottom openings can be smaller, the same, or larger than the corresponding signal line widths (not shown). The height 'h' (or depth) of the openings can be adjusted based on the bandwidth requirements of the interconnects.

In the preferred embodiments, as explained below, it is an objective of the present invention to provide some calculated data for the high-speed interconnects, as shown in FIGS. 12A, 12B, 12C, 13A, 13B, 14A, and 14B. These are the explanatory graphs showing the advantages of the techniques employed by the present invention. For each of the calculations, epoxy-glass (FR4) is used as the PCB material to show performance improvement. As mentioned earlier, this invention also covers all materials having dielectric properties and can be used as a PCB material. The present invention also covers all interconnects with open trenches and utilizes a semiconductor as the base material, such as silicon, GaAs, InP etc., to make high-speed on-chip interconnects to connect two or more electronic devices (e.g. transistors).

Figure 12A:
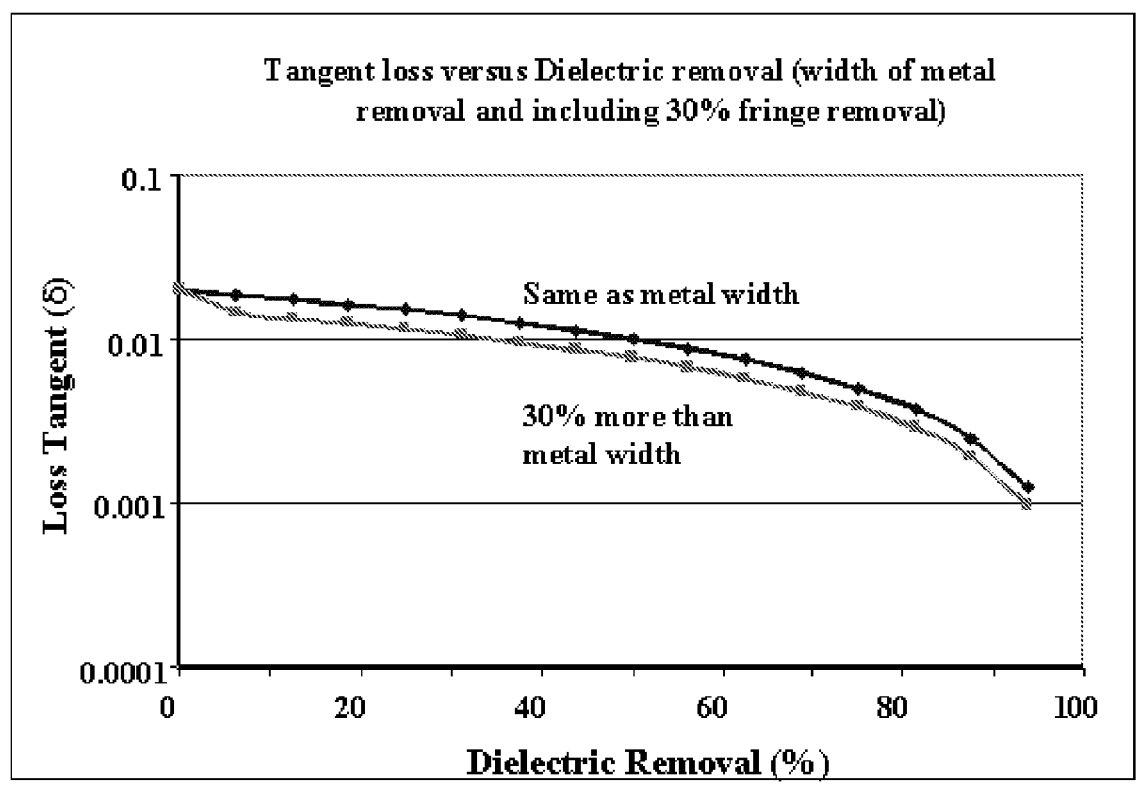
FIGS. 12A, 12B, and 12C, are the graphs showing the variation of the dielectric constant and dielectric loss as a function of the dielectric removal to form the open trenches. This is an explanatory graph to showing the advantage of this invention. In this calculation, FR4 is considered as the PCB's dielectric material.
Figure 12B:
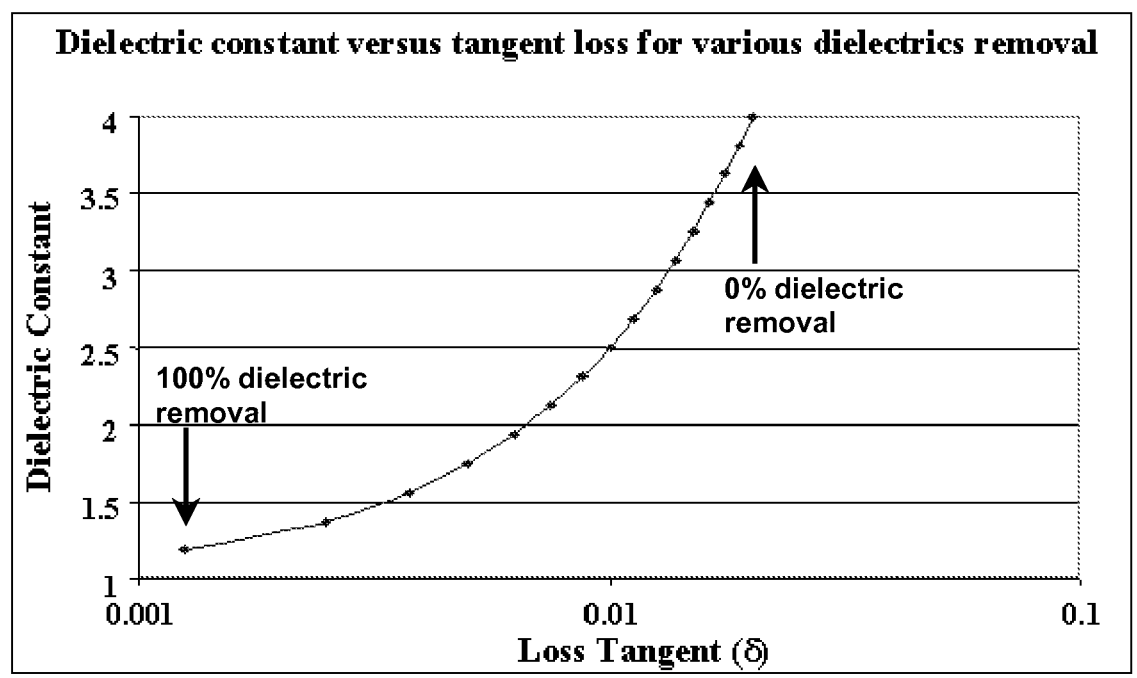
Figure 12C:
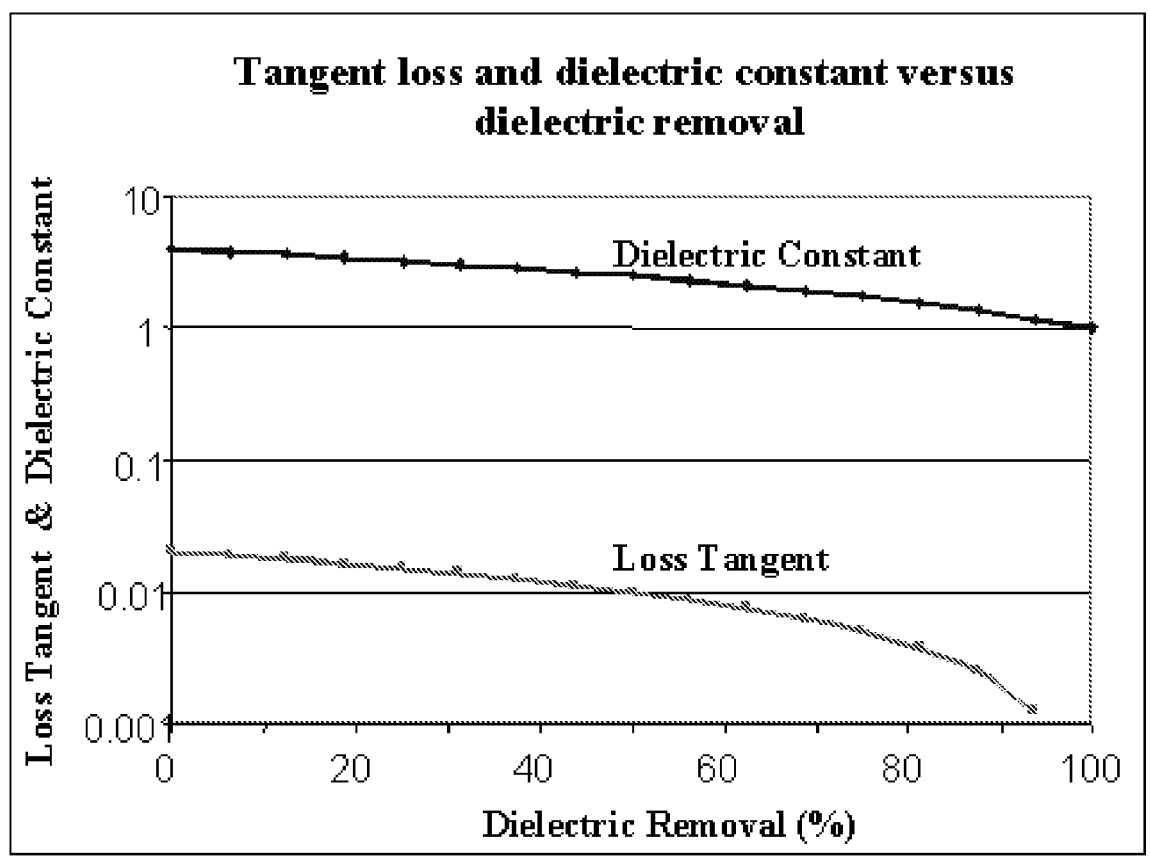

FIGS. 12A, 12B, and 12C show the estimated results for variation of the dielectric loss tangent and dielectric constant as a function of removal of dielectric material to form an open trench (for example, 22, 24A and 24B in FIG. 4). It should be noted that the estimated results shown in FIGS. 12A, 12B, and 12C are simulated for conventional PCB materials such as FR4 (epoxy-glass) having a dielectric constant and dielectric loss tangent (dielectric loss) of 4.0 and 0.02, respectively. Variations in the dielectric constant and dielectric loss tangent depicted in different traces in FIGS. 12A, 12B and 12C are shown as a function of dielectric removal. The estimated dielectric constant and dielectric loss tangent after dielectric removal in open trenches are equivalent to effective dielectric constant and effective dielectric loss tangent, respectively. The effective dielectric constant and effective dielectric loss tangent for 100% dielectric removal are assumed to be 1.0 and 0.0, respectively. In the estimation, the width of the dielectric removal is considered to be the same as that of the signal line (metal) width, unless mentioned otherwise. If the width of the trenches is made wider than the signal line width, less dielectric removal is required to achieve a desired effective dielectric constant and an effective dielectric loss tangent.

The two traces shown in FIG. 12A represent variation in dielectric loss tangent as a function of percentage dielectric removal for a trench width same as the signal line (metal) width, and for a 30% wider trench (upper and lower traces, respectively). It should be noted that for a wider trehcn, the dielectric loss tangednt is lower as the dielectric removal increases. In FIG. 12B variation in dielectric constant as a function of dielectric loss tangent for two extreme cases of 100% dielectric removal (left bottom) and 0% dielectric removal (right top), respectively, are depicted. As shown therein, the dielectric loss tangent and the dielectric constant is higher when the percentage of dielectric removal is small. The trace shown in FIG. 12B can be derived from the traces shown in FIG. 12C where variations in dielectric constant and dielectric loss tangent as functions of percentage dielectric removal are depicted in the upper and lower traces, respectively. It should be noted that the traces shown in FIGS. 12B and 12C are simulated for trench width equal to the signal line (metal) width.

Figure 13A:
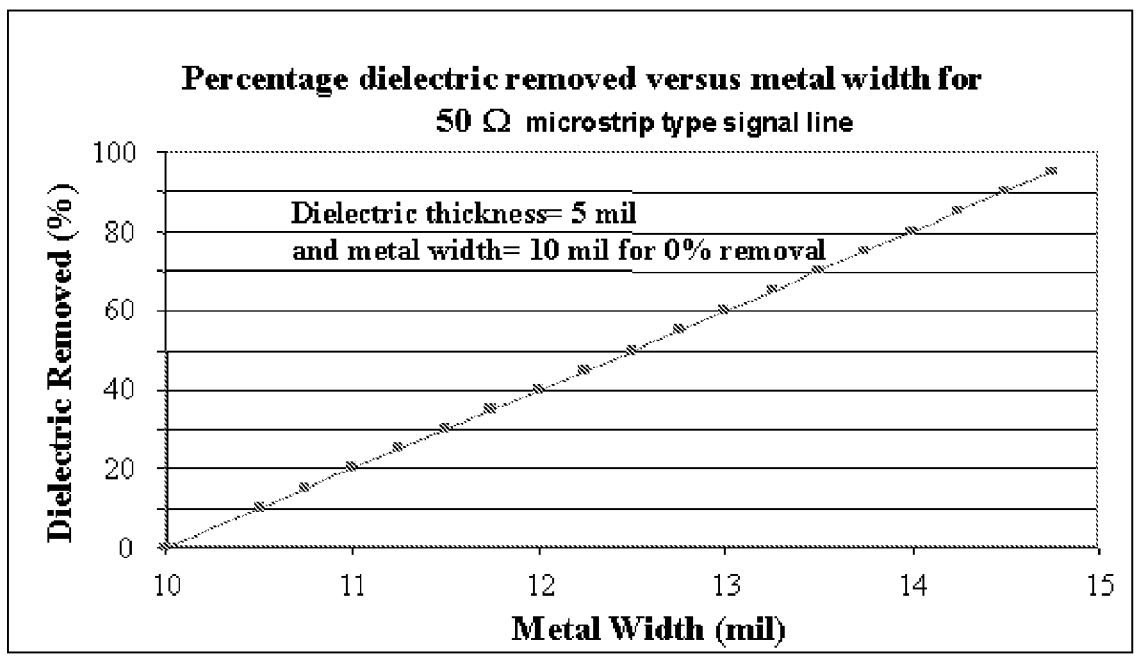
FIGS. 13A and 13B are the graphs showing the variation of the dielectric constant as function of the signal line width with various dielectrics layer thicknesses as a parameter. This is an explanatory diagram for the microstrip type signal lines, showing the advantage of this invention. Various designs can be used get the maximum benefits of the inventions. In this calculation, FR4 is considered as the PCB's dielectric material.
Figure 13B:
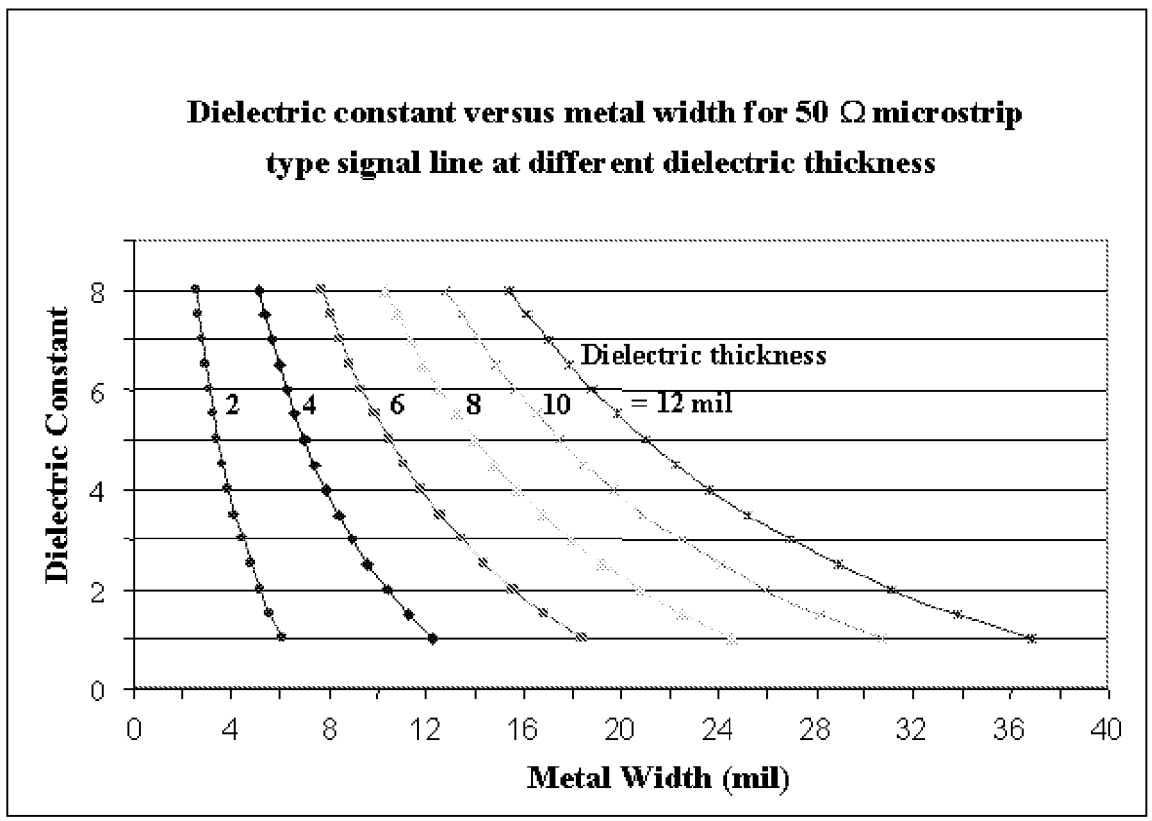
Figure 14A:
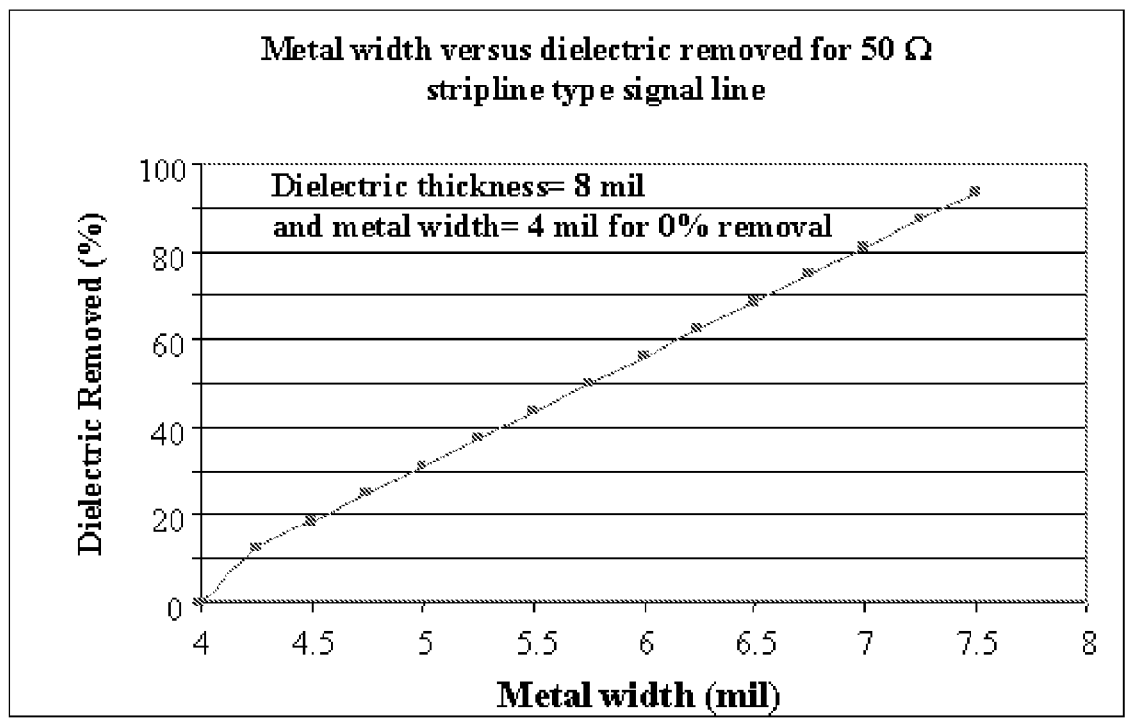
FIGS. 14A and 14B are the graphs showing the variation of the dielectric constant as function of the signal line width with various dielectrics layers thicknesses as a parameter. This is an explanatory diagram for the stripline type signal lines, showing the advantage of this invention. Various designs can be used to get the maximum benefits of the inventions. In this calculation, FR4 is considered as the PCB's dielectric material.
Figure 14B:
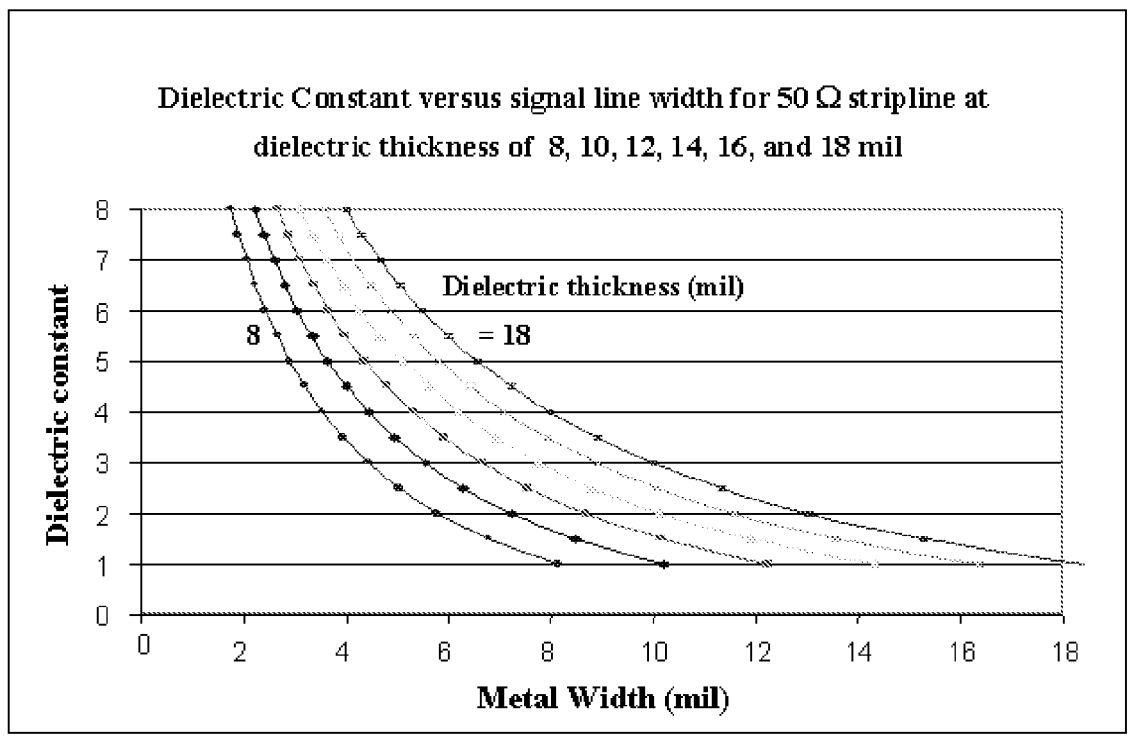

FIGS. 13A and 13B, and FIGS. 14A and 14B show the estimated results for variation of the loss tangent and dielectric constant as a function of the dielectric removal for the interconnects having opened trenches. The results shown in FIGS. 13A, 13B, 14A, and 14B are for the conventional PCB material for example, FR4. All assumptions explained in conjunction with FIGS. 12A, 12B, and 12C also apply here, so that a repeated explanation is omitted. According to this invention, as the effective dielectric constant is reduced, it is necessary to design/adjust the metal (signal line) width to keep characteristics impedance constant. The signal line width should be kept wider than the signal line with no dielectric removal. FIGS. 13A and 14A show metal width variation as a function of dielectrics removal for the microstrip type and stripline type signal lines, respectively. 0.0% dielectric removal indicates the conventional type interconnects without opened trenches. 100% dielectric removal indicates no-dielectrics under the signal lines, and in this case, effective dielectric constant and effective dielectric loss are 1.0 and 0.0, respectively. FIGS. 13B and 14B are results showing the dielectric constant versus signal line width with the dielectric thickness as parameters for the microstrip type (for FIG. 13B) and stripline type (for FIG. 14B) signal lines, respectively. These are given to show the benefits of this invention. All results shown here are for the interconnects with a 50 ohm characteristics impedance. As depicted, to keep characteristics impedance constant, either signal line width must be wider or the thickness of the dielectric must be thinner than the interconnects without opened trenches.

Figure 15:
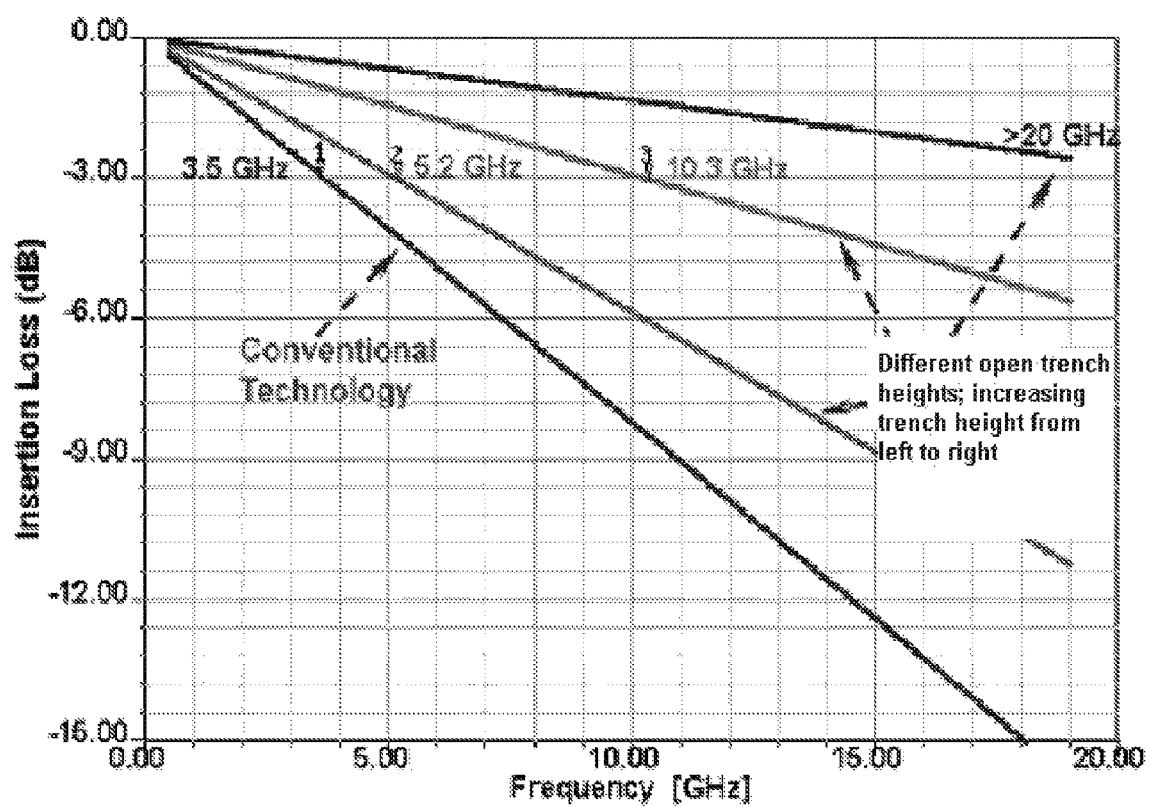
FIG. 15 depicts a graph showing the bandwidth of the interconnects for various percentages of the dielectrics removal under the signal lines to form the open trenches. This is an explanatory diagram to show the advantages of this invention. Various designs can be used to get the maximum benefits of these inventions. In this calculation, an FR4-based PCB 30 cm long was considered for the calculations.

FIG. 15 compares the frequency responses to insertion loss for different open trench heights, that is, different percentages of dielectric removal. As explained in conjunction with FIGS. 12A, 12B, 12C, 13A, 13B, 14A, and 14B, all results correspond to conventional FR4 materials as the PCB material. According to this invention, the interconnects can be designed with controlled bandwidth by removing the appropriate amount of dielectric material from the interconnects. As depicted in FIG. 15, based on the percentage of the dielectric removal, the bandwidth can be increased to 20 GHz and beyond.

FIG. 16A is the top view and FIGS. 16B and 16C are cross-sectional views along the AA and BB directions, respectively of FIG. 16A, wherein the like parts are indicated by like numerals, so that similar explanations are omitted here. In the present invention, two interconnected chips on the PCB 77 are shown (a central processing unit (CPU) and memory). As an example, processor 120 and memory 130 are interconnected on PCB 77, which comprises high-speed signal lines 78, core layers 80, prepreg 82 to stack the several core layers 80, and the ground (or power line) 84. The core layers may or may not have the open trenches 86, depending on whether they carry the high-speed signal lines. The high-speed signal line 78 can be located on top of the PCB layer and lower speed signal line can be located on the lower layer. This would reduce the possibility of any discontinuities, which may arise due to the vias. Bandwidth of the interconnects using of the technique as mentioned previously, can be attained and thereby on-chip's signal speed can be preserved. For simplicity, only enlarged portions of cross-sectional views for high-speed (e.g. processor and memory) chips are shown. Complete PCBs with lower-speed chip interconnects are not shown.

Figure 16:
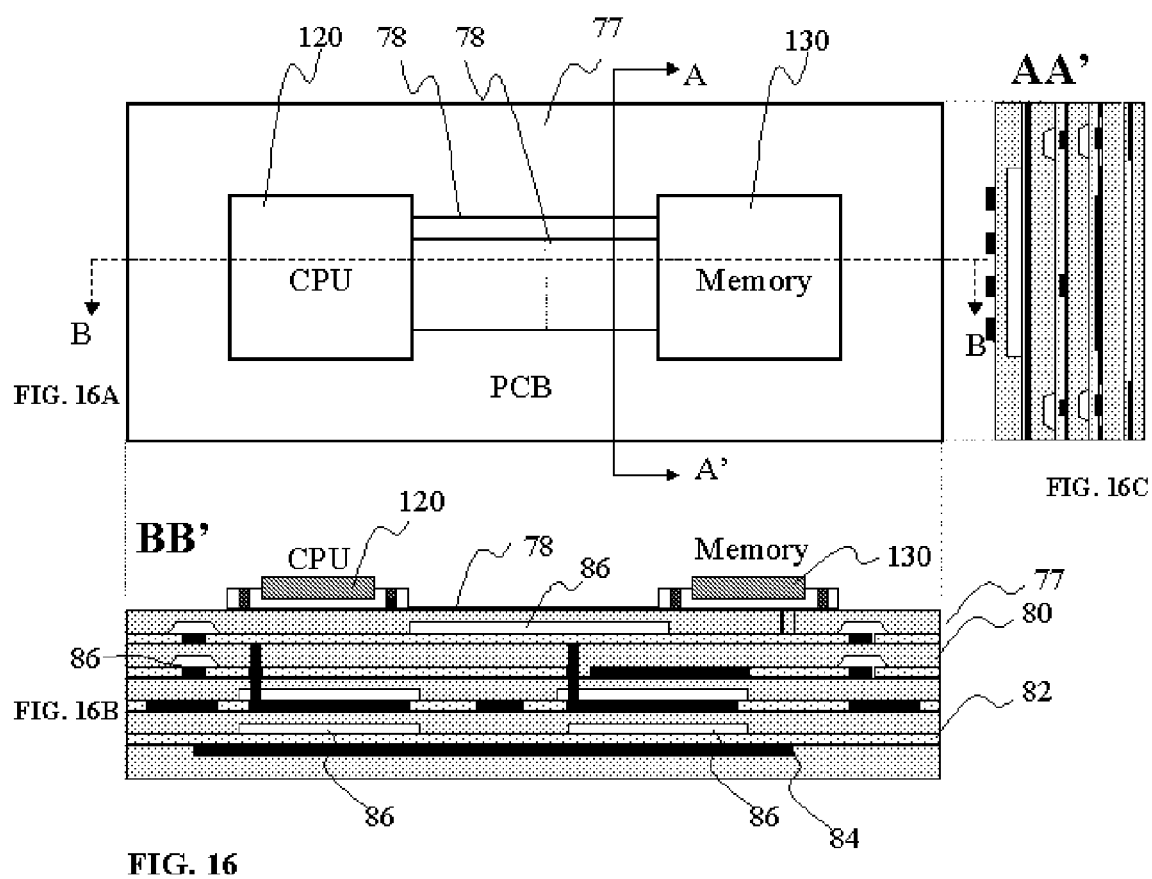
FIG. 16A is the top view and FIGS. 16B and 16C are the side and front cross-sectional views, respectively, taken along AA' and BB' of FIG. 16A, illustrating the inter-chip (off-chip) interconnects consisting of multilayered high-speed PCB in the first preferred embodiment according to the present invention.

FIG. 17A is the top view and FIGS. 17B and 17C are enlarged cross-sectional views along AA' and BB' of FIG. 17A, wherein the like parts are indicated by like numerals used in FIGS. 4 and 16, so that similar explanations are omitted here. Two chips interconnected are shown. FIG. 17B shows a multi-chip-module employing the high-speed interconnects of the present invention. For connecting the processor and memory, a PCB with back-side open trenches or slots can be used and they can be fabricated using the process and design as explained in conjunction with FIGS. 6, 7A-7F, 8, 9, and 10. Each board has the pins 90 coming out from the outside of the PCB 88 which can be mountable on to the motherboard made from the conventional PCB materials for more integration and for ground/power and low-speed connections.

The dielectric materials includes all kinds of ceramic and polymer materials, as mentioned above.

According to this invention, semiconductor material such as Silicon, GaAs, InP, SiC, GaN, Ge etc. can also be used as the interconnect base material for making the high-speed on-chip interconnects to connect two or more electronic devices (e.g. transistors).

According to this invention, the opened trenches can be filled with coolant so that by using this structure, PCB cooling is also possible.

According to this invention, flow or no-flow type prepregs can be used for stacking the multiple core layers with signal or ground lines. It is highly desirable to use thinner prepregs in order to get maximum performance advantages. For prepreg materials, conventional available prepregs, such as those marketed by Polyclad™, Arlon™, etc., can be used. The prepregs type could be flow or no-flow type based on the pressure and temperature of the process during the stacking the core layers. In order to avoid complete prevention of the prepreg from flowing into the trenches, no flow type prepreg can be used. By process optimization, the trenches can be made to open as designed and the designed response can be made close to the experimental response.

The process condition should be optimized to achieve maximum performance. Absorption of the water during the process may occur. High temperature (below dielectric glass transition temperature) annealing before stacking removes the water molecules as absorbed during or after the process. The water-resistant coating can be used on the trench surface after the trenches are opened (and before stacking) to prevent the water or gas absorption during the process, which may reduce reliability.

In the preferred embodiments as explained in conjunction with FIGS. 12A-12B, 13A-13B, 14A-14B, and 15, only the FR4-based PCB design parameters are shown as an example. These results show the benefits of this invention as well as the various designs available for the interconnects according to this invention. Optimized design parameters should be based on the materials parameters and interconnects structure, and these optimized design parameters can be achieved using the three-dimensional (3-D) field solution. For other dielectric based PCBs (whether rigid or flex), similar designs can be used to achieve maximum performance.

In the preferred embodiments as explained in FIGS. 4, 5A-5B, 6, 7A-7F, 8, 9, 10, 11A-11D, 12A-12C, 13A-13B, 14A-14B, 15, 16, and 17, each core dielectric (sheet material), consisting of the dielectric and copper (or any metal) layer, is considered for simplicity. This invention also covers the PCB build-up made from a core consisting of a copper layer, dielectric and prepreg (epoxy). For this build-up, the process is the same as explained above, except for opening the back-side open trench, which passes through all the epoxy and through the dielectrics material (as much as necessary for the system bandwidth requirements). For prepreg materials, conventional prepregs can be used, such as those marketed by companies such as Polyclad™ and Arlon™. The prepreg could be flow or no-flow type, depending on the pressure and temperature of the process during the stacking of the core layers. In order to prevent the prepreg from flowing into the trenches, no flow type prepreg can be used. By process optimization, the trenches can be made to open as designed and the designed response can be made close to the experimental response.

In the preferred embodiments, as explained in conjunction with FIGS. 4, 5A-5B, 6, 7A-7F, 8, 9, 10, 11A-11D, 12A-12C, 13A-13B, 14A-14B, 15, 16, and 17, only strip line and microstrip line configurations are considered. However, in accordance with the present invention, other signal lines, such as coplanar line configuration with single or multiple signal lines (as single or differential) could also be employed in the present invention. Dielectric coverage using the same or different dielectric materials can also be used.

In the preferred embodiments, as explained in conjunction with FIGS. 4, 5A-5B, 6, 7A-7F, 8, 9, 10, 11A-11D, 12A-12C, 13A-13B, 14A-14B, 15, 16, and 17, the trenches can be square or rectangular-shaped, or any shape convenient for manufacturing. The trenches are shown opened at the back side of the core-layer (i.e. on the opposite side of the signal lines). The present invention also covers trenches located in close proximity to the bottom and/or top of the signal lines. The trench can also be opened at the middle of the cross-section of the core layer.

In the preferred embodiments, as explained in conjunction with FIGS. 4, 5A-5B, 6, 7A-7F, 8, 9, 10, 11A-11D, 12A-12C, 13A-13B, 14A-14B, 15, 16, and 17, the ground plane is located in close proximity to the prepreg and the opened trench (in the case of the strip-type and microstrip type lines). This invention also covers the ground plane not located under (and over) the trench openings. The ground plane can be located on the side of the open trenches.

The present invention has been described above by way of its embodiments. However, those skilled in the art can reach various changes and modifications within the scope of the idea of the present invention. Therefore it should be understood that such minor changes and modifications also belong in the range of this invention. For example, the present invention can be variously changed without departing from the gist of the invention, as indicated below.

The present invention has also been described above for the high-speed rigid PCB. This technique to increase the bandwidth can also be implemented into the high-speed flex-printed circuit fabrication. Related dielectrics, as appropriate, can also be used for this purpose.

According to the present invention, it is the object to provide the high-speed PCB with interconnects having open trenches for reducing the microwave loss for increasing the bandwidth of the interconnects. It is also the object to use any dielectric material (including conventional dielectric material and the manufacturing technology) in the technique, which could increase the bandwidth tremendously. For simplicity, the preferred embodiments are described mostly considering the microstrip line and strip line configurations. However, all line configurations such as coplanar line with single or multiple signal line (including differential line) are also covered by this invention.

According to the present invention, the high-speed PCB with an interconnection system uses an inhomogeneous dielectric system consisting of the dielectrics and the portion of air (or a vacuum) to reduce the effective dielectric loss and dielectric constant, wherein the inhomogeneous dielectric system has two or more dielectrics, and one of the dielectrics has a lower dielectric loss. In the preferred embodiment, open trenches with air are used in the high-speed PCB. Alternatively, low dielectric loss (and/or low dielectric constant) materials or liquid crystal polymer could fill up the trench.

According to this present invention, the dielectric and loss tangent variation are estimated based on the assumption that the electric field is accumulated under the signal lines, to show the advantages of the preferred embodiments and to make estimation simple. In fact, the electric field is spread outside the signal line. More dielectric constant and dielectric loss variation are possible if the trench width is wider than the signal line width, and they can be extended to both sides of the trench.

Several preferred embodiments for high-speed off-chip interconnects and their manufacturing processes are described considering the microstrip line (and also strip-line) configuration, with the dielectric system with a back-side open trench or slot. All signal line configurations such as micro-strip line, strip line or coplanar type are covered by under this invention. The shape of the trench could be any type such as square, rectangular, circular, trapezoidal or any polynomial shape, or any shape convenient for manufacturing. These can be filled with dielectric material having a lower dielectric constant than the dielectric substrate.

According to this invention, the high-speed interconnects on the PCB (or PWB) are disclosed. The fundamental techniques provided in this invention can also be used for high-speed packaging. More-over, this fundamental technology can also be used for the high-speed die package and can be used to increase the bandwidth of the interconnects.

Although the invention has been described with respect to specific embodiments for complete and clear disclosure, the appended claims are not to be thus limited but are to be construed as embodying all modification and alternative constructions that may be occurred to one skilled in the art which fairly fall within the basic teaching set forth in this specification.

The present invention is expected to be found practically useful in the high-speed on-chip, and off-chip interconnects, where the signal speed is 5 Gb/s and beyond, where conventional materials are used, and where the bandwidth of the interconnects can be made close to the speed of light for no-loss transmission lines. The present invention can also be implemented in the high-speed single or multiple signal connectors, and high-speed cables (not shown). The applications include on-chip interconnects where high-speed electronics chips or electronics chips with optical chips need to be connected. Ideally, the bandwidth of the interconnect system can be made close to that of fiber, and future monolithic (and also hybrid near future) integration of electronics and optical chips can also be interconnected without sacrificing the chips speed. The application also includes the high-speed multichip module interconnection, 3-D chip or memory interconnection, high-speed parallel system for computer animation and graphics for high-speed 2-D or 3-D video transmission, high-bandwidth image display, high-speed routers where high-speed electronics switches (or ICs) needed to be interconnected. The application also includes the high-speed (5 Gb/s and beyond) connectors and cables for high-speed board-to-board or rack-to-rack interconnections, and also single or multiple high-density signal connections and carrying connections from one side to the other side in a longer path.

What is claimed is:

1. A multi-layered high speed printed circuit board (PCB) for interconnecting one or more electronic elements, the multi-layered printed circuit board comprising:
   at least one, first dielectric system further comprising;
      at least one dielectric layer, and
      at least one electrical signal line overlying on a first surface of said at least one dielectric layer, and at least one backside open trench on a second opposing surface of said at least one dielectric layer, wherein said at least one backside open trench is located under, and aligned with the at least one electrical signal line; and
      at least one prepreg layer located under said second surface; and
   at least one, second dielectric system comprising;
      at least one other dielectric layer
      at least one ground/power plane overlying on a first surface of said at least one other dielectric layer, and at least one other backside open trench on a second opposing surface of said at least one other dielectric layer; and
      at least one other prepreg layer located under said second surface of the at least one other dielectric layer;
   wherein one or more of said first and second dielectric systems are stacked alternately, such that in a stack,
      the at least one first dielectric system overlies said ground/power plane of said at least one second dielectric system wherein, said at least one electrical signal line aligned with said at least one backside open trench and, said at least one ground/power plane provide a microstrip type transmission line, and
      the at least second dielectric system overlies a second one of the at least one first dielectric system wherein, a second one of at least one electrical signal line aligned with said at least one backside open trench located in the second one of the at least one first dielectric system, stacked between said at least one ground/power plane and a second one of a ground/power plane provide a stripline type transmission line, and wherein the shape of said at least one, and said at least one other backside open trenches in the at least one first and at least one second dielectric systems is the one selected from a group consisting of a circle, a cylinder, a sphere, a trapezoid and a square.

2. The printed circuit board according to claim 1, wherein said at least one prepreg layer is a continuous layer located between said at least one first and at least one second dielectric systems in the stack.

3. The printed circuit board according to claim 1, wherein said printed circuit board is constructed from one selected from a group consisting of a rigid circuit board, a flex circuit board, and a combination of both.

4. The printed circuit board according to claim 1, wherein said at least one, and said at least one other dielectric layers of said at least one first and at least one second dielectric systems, respectively, comprise epoxy-glass composites, polymers including polyimide, resin, alumina, boron nitride, silicon oxide, aluminum nitride, low temperature or high temperature ceramics, silicon nitride, or PTFE.

5. The printed circuit board according to claim 1, wherein said at least one other backside open trench located in said at least one other dielectric layer is aligned vertically, with the at least one backside open trench in said at least one first dielectric layer in the microstrip type and the stripline type transmission line.

6. The printed circuit board according to claim 1, wherein said microstrip type, and stripline type transmission line are laid in a single-ended or a differential-ended coplanar configuration, such that the said electrical signal line and at least one additional ground line overlies on the first surface of the at least one first dielectric layer.

7. The printed circuit board according to claim 1, wherein the second one of the ground/power plane in the stack overlies on a dielectric layer that is one selected from a homogeneous dielectric layer and a dielectric layer including at least one open trench located within the dielectric layer.

8. The printed circuit board according to claim 1, wherein said at least one and at least one other backside open trenches of said at least one first and at least one second dielectric systems, respectively, are filled with a material selected from a group consisting of air and a material of lower dielectric loss than the respective dielectric losses of said at least one and at least one other dielectric layers of said at least one first and said at least one second dielectric systems, respectively.

9. The printed circuit board according to claim 1, wherein said at least one, and said at least one other dielectric layers of said at least one first and at least one second dielectric systems, respectively, comprise any material with dielectric properties suitable for constructing a printed circuit board.

10. A multi-layered high speed printed circuit board (PCB) for interconnecting one or more electronic elements, the multi-layered printed circuit board comprising:
  at least one, first dielectric system comprising:
    at least one dielectric layer and;
    at least one electrical signal line overlying on a first surface of said at least one dielectric layer, and at least one backside open trench on a second opposing surface of said at least one dielectric layer, wherein said at least one backside open trench is located under, and aligned with the at least one electrical signal line; and
    at least one prepreg layer located under said second surface; and
  at least one, second dielectric system comprising:
    at least one other dielectric layer and
    at least one ground/power plane overlying on a first surface of said at least one other dielectric layer, and at least one other backside open trench on a second opposing surface of said at least one other dielectric layer; and
    at least one other prepreg layer located under said second surface of the at least one other dielectric layer;

wherein one or more of said first and second dielectric systems are stacked alternately, such that in a stack,
  the at least one first dielectric system overlies said ground/power plane of said at least one second dielectric system, such that, said at least one electrical signal line aligned with said at least one backside open trench, and said at least one ground/power plane provide a microstrip type transmission line, and
  the at least second dielectric system overlies a second one of at least one first dielectric system such that, a second one of at least one electrical signal line aligned with said at least one backside open trench located in the second one of the at least one first dielectric system, stacked between said at least one ground/power plane and a second one of a ground/power plane provide a stripline type transmission line, wherein said microstrip type, and stripline type transmission line are laid in a single-ended or a differential-ended coplanar configuration, such that said electrical signal line and at least one additional coplanar ground line overlies on the first surface of the at least one first dielectric layer.

11. The printed circuit board according to claim 10, wherein said printed circuit board is constructed from one selected from a group consisting of a rigid circuit board, a flex circuit board, and a combination of both.

12. The printed circuit board according to claim 10, wherein the second one of the ground/power plane in the stack overlies on a dielectric layer that is one selected from a homogeneous dielectric layer and a dielectric layer including at least one open trench located within the dielectric layer.

13. The printed circuit board according to claim 10, wherein said at least one backside open trench and said at least one other backside open trench of said at least one first and at least one second dielectric systems are vertically aligned with said at least one electrical signal line.

14. The printed circuit board according to claim 10, wherein said at least one and at least one other backside open trenches of said at least one first and at least one second dielectric systems, respectively, are filled with a material selected from a group consisting of air and a material of lower dielectric loss than the respective dielectric losses of said at least one and at least one other dielectric layers of said at least one first and said at least one second dielectric systems, respectively.

15. The printed circuit board according to claim 10, wherein said at least one, and said at least one other dielectric layers of said at least one first and at least one second dielectric systems, respectively, comprise any material with dielectric properties suitable for constructing a printed circuit board.

16. The printed circuit board according to claim 10, wherein said at least one, and said at least one other dielectric layers of said at least one first and at least one second dielectric systems, respectively, comprise epoxy-glass composites, polymers including polyimide, resin, alumina, boron nitride, silicon oxide, aluminum nitride, low temperature or high temperature ceramics, silicon nitride, or PTFE.

* * * * *